US010340813B2

(12) United States Patent
Schumacher et al.

(10) Patent No.: US 10,340,813 B2
(45) Date of Patent: Jul. 2, 2019

(54) ELECTRONIC POWER CONVERTER AND COMPUTER PROGRAM

(71) Applicant: Technische Universitaet Braunschweig, Braunschweig (DE)

(72) Inventors: Walter Schumacher, Ohrum (DE); Michael Homann, Vordorf (DE)

(73) Assignee: TECHNISCHE UNIVERSITÄT BRAUNSCHWEIG, Braunschweig (DE)

( * ) Notice: Subject to any disclaimer, the term of this patent is extended or adjusted under 35 U.S.C. 154(b) by 0 days.

(21) Appl. No.: 15/319,630

(22) PCT Filed: Jun. 18, 2015

(86) PCT No.: PCT/EP2015/063718
§ 371 (c)(1),
(2) Date: Dec. 16, 2016

(87) PCT Pub. No.: WO2015/193439
PCT Pub. Date: Dec. 23, 2015

(65) Prior Publication Data
US 2017/0179844 A1    Jun. 22, 2017

(30) Foreign Application Priority Data

Jun. 20, 2014    (DE) .................. 10 2014 108 667

(51) Int. Cl.
*H02M 7/06*        (2006.01)
*H02M 7/5387*      (2007.01)
(Continued)

(52) U.S. Cl.
CPC ............. *H02M 7/06* (2013.01); *H02M 1/084* (2013.01); *H02M 7/53873* (2013.01);
(Continued)

(58) Field of Classification Search
CPC .... H02M 7/06; H02M 1/084; H02M 7/53875; H02M 7/53873; H02M 2001/0012;
(Continued)

(56) References Cited

U.S. PATENT DOCUMENTS 4,079,329 A * 3/1978 England .............. H04L 27/2273
329/309
5,825,901 A * 10/1998 Hisey ..................... H02K 26/00
381/165

(Continued)

FOREIGN PATENT DOCUMENTS

DE    10 2012 210 656 A1    12/2013
EP         1 049 241 A2    11/2000

OTHER PUBLICATIONS

Received STIC search report from EIC 2800 searcher John DiGeronimo on Jul. 26, 2017.*

(Continued)

*Primary Examiner* — Nguyen Tran
*Assistant Examiner* — Htet Z Kyaw
(74) *Attorney, Agent, or Firm* — W & C IP

(57) ABSTRACT

Multi-phase electronic power converter (50) for outputting multi-phase alternating current, wherein for every phase the current converter (50) comprises a power output (52) controlled via at least two semiconductor switches (51) connected in a half-bridge circuit, wherein the electronic power converter (50) has a control device (53) which is configured for processing a target value signal of the control device (53) supplied as an input signal, each in the form of a bit stream (1, 2, 3, 30, 31, 32) of one or more bits for every phase, characterized in that the control device (53) is configured by means of space-vector modulation to generate actuation (Continued)

signals (P1, P2, P3) of the semiconductor switches (51) in relation to the bit streams (1, 2, 3, 30, 31, 32) supplied as an input signal.

20 Claims, 12 Drawing Sheets

(51) Int. Cl.
  *H02M 1/084* (2006.01)
  *H03M 7/30* (2006.01)
  *H02M 1/00* (2006.01)

(52) U.S. Cl.
  CPC ..... *H02M 7/53875* (2013.01); *H03M 7/3082* (2013.01); *H02M 2001/0012* (2013.01); *H02M 2007/53876* (2013.01)

(58) Field of Classification Search
  CPC ....... H02M 2007/53876; H02M 7/537; H02M 1/08; H02M 7/003; H02M 5/458; H02M 7/5387; H02M 7/217; H03M 7/3082; H02P 7/29
  USPC ..... 363/126, 95, 40, 98, 127, 132, 137, 129, 363/125, 41, 34, 124, 71, 123, 131, 37, 363/39, 13, 43, 67, 52; 318/801, 808, 318/722, 800, 809, 34, 810, 811, 812
  See application file for complete search history.

(56) References Cited

U.S. PATENT DOCUMENTS

| | | | | |
|---|---|---|---|---|
| 6,133,650 A * | 10/2000 | Miyamoto | ........ | H02M 3/33523 307/28 |
| 6,201,720 B1 | 3/2001 | Tracy et al. | | |
| 6,380,703 B1 * | 4/2002 | White | .................... | G11B 19/28 318/400.04 |
| 6,643,149 B2 * | 11/2003 | Arnet | ................ | H02M 7/53875 363/131 |
| 6,653,812 B1 * | 11/2003 | Huo | .................. | H02M 7/53875 318/801 |
| 6,911,801 B2 * | 6/2005 | Youm | ............... | H02M 7/53871 318/599 |
| 7,348,758 B2 * | 3/2008 | Ho | .................... | H02M 7/53875 318/599 |
| 7,545,110 B2 * | 6/2009 | Williams | ............ | H02M 7/5387 318/254.1 |
| 7,558,089 B2 * | 7/2009 | Mese | .................... | H02M 7/487 363/52 |
| 7,728,538 B2 * | 6/2010 | D'Angelo | ......... | H02M 7/53871 318/400.02 |
| 7,881,081 B1 * | 2/2011 | Tallam | .................... | H02M 1/44 363/41 |
| 7,923,960 B2 * | 4/2011 | Hobraiche | ........ | H02M 7/53875 318/767 |
| 8,427,243 B2 * | 4/2013 | Chen | .................... | H03C 3/0925 327/156 |
| 8,730,702 B2 * | 5/2014 | Stern | .................... | H02M 7/5395 363/131 |
| 8,885,760 B2 * | 11/2014 | Haase | .................... | H03M 3/438 375/295 |
| 8,976,556 B2 * | 3/2015 | Teo | ........................ | H02M 7/487 363/123 |
| 9,030,137 B2 * | 5/2015 | Williams | ................ | H02P 6/007 318/400.01 |
| 9,041,326 B2 * | 5/2015 | Gunselmann | ........ | B62D 5/0484 318/400.01 |
| 9,124,195 B2 * | 9/2015 | Weinmann | ............ | H02P 27/085 |
| 9,190,925 B2 * | 11/2015 | Yamamoto | ............ | H02M 5/297 |
| 9,502,998 B1 * | 11/2016 | Si | .......................... | H02M 7/00 |
| 9,515,572 B2 * | 12/2016 | Hirsch | ................ | H02M 7/5395 |
| 9,621,072 B2 * | 4/2017 | Bernet | ................ | H02M 7/5387 |
| 9,660,564 B2 * | 5/2017 | Zhao | .................... | H02P 21/0021 |
| 9,912,251 B2 * | 3/2018 | Mondal | ................ | H02M 7/487 |
| 2002/0079706 A1 * | 6/2002 | Rebsdorf | ............... | H02P 9/007 290/55 |
| 2002/0196645 A1 | 12/2002 | Oba et al. | | |
| 2005/0162137 A1 * | 7/2005 | Tracy | ..................... | H02J 9/062 323/217 |
| 2008/0266918 A1 | 10/2008 | Vilain et al. | | |
| 2009/0040085 A1 * | 2/2009 | Swain | ..................... | H03M 1/48 341/143 |
| 2009/0212733 A1 * | 8/2009 | Hsieh | ................. | H02M 7/53875 318/729 |
| 2012/0020430 A1 * | 1/2012 | Haase | .................... | H03M 3/438 375/295 |
| 2012/0320650 A1 * | 12/2012 | Weinmann | ............ | H02P 27/085 363/132 |
| 2014/0042938 A1 | 2/2014 | Shoji et al. | | |
| 2015/0016170 A1 * | 1/2015 | Olarescu | ................. | H02M 7/00 363/132 |
| 2015/0145571 A1 * | 5/2015 | Perrott | ..................... | H03L 7/093 327/159 |
| 2015/0155795 A1 * | 6/2015 | Hirsch | .................... | H02M 1/32 318/400.26 |
| 2015/0281613 A1 * | 10/2015 | Vogelsang | ......... | H04N 5/35545 348/300 |
| 2016/0218711 A1 * | 7/2016 | Grambichler | ........ | H03K 5/1536 |
| 2016/0359442 A1 * | 12/2016 | Zhao | .................... | H02P 21/0021 |

OTHER PUBLICATIONS

Received STIC search report from EIC 2800 searcher Samir Patel on Feb. 14, 2019. (Year: 2019).*
Yu; "Space Vector PWM with TMS320C24x/F24x Using Hardware and Software Determined Switching Patterns"; Texas Instruments Application Report SPRA524; Digital Signal Processing Solutions, Mar. 1999, pp. 1-44.
Bradshaw et al.; "Bit-Stream Control of Three Phase Reversible Rectifiers"; Energy Conversion Congress and Exposition (ECCE), 2009, pp. 2777-2783.
Bradshaw et al.; "Bit-Stream space vector modulators"; IET Power Electronics, vol. 5, issue 2, 2012, pp. 205-214.

* cited by examiner

ELECTRONIC POWER CONVERTER AND COMPUTER PROGRAM

FIELD OF THE INVENTION

The invention relates to a polyphase power converter for outputting polyphase alternating current which employs a control device that is configured for generating by space vector modulation actuation signals. Switching logic generates switching sequences of the space vector modulation utilizing state bit which correspond to the actuation signals and at least one additional bit which indicates a running direction in a cycle of a voltage space vector. The space vector modulation used by the control device has an angle hysteresis of the voltage space vector. The invention additionally relates to a computer program which, when implemented by the control device, controls the polyphase power converter.

BACKGROUND

Electrical drives are supplied nowadays from switched power sections which are usually driven with pulse-width-modulated signals (PWM signals). For this purpose, power converters are used which for each phase of the electrical machine to be controlled have a power output controlled via at least two semiconductor switches connected in a half-bridge circuit. In the prior art, there are various possibilities for generating the driving signals of the semiconductor switches, e.g. outputting a PWM signal with a fixed switching frequency with standard components using digital technology. For this purpose, control words having a word width of a plurality of bits can be written to the components. The digital logic generates therefrom the pulse-width-modulated driving signals for the semiconductor switches. What is disadvantageous here is that, on account of the synchronous logic, the switching patterns can be changed only before two points in time at the beginning and in the middle of the switching frequency period.

Proposals for controlling electrical machines are given e.g. by DE 10 2012 206 323 A1 or the thesis by Jonathan Bernard Bradshaw, "Bit-Streams Control of Doubly Fed Induction Generators", Mar. 7, 2012, University of Auckland, New Zealand.

A further disadvantage of known power converters for controlling electrical machines is that the PWM signals are generated with a fixed switching frequency that is usually in the range perceptible to human beings. Therefore, the operation of the electrical machine is then accompanied by a frequently disturbing, uniform secondary noise, e.g. high-frequency whistling. If the switching frequency is put outside the audible range, increased switching losses arise.

A further disadvantage of known power converters is that the pulse width modulation is effected in an open loop in the customary digital embodiment. The driving signals for the semiconductor switches are transmitted to the power section and, as a result of diverse effects, the voltage-time integrals actually present at the load, i.e. at the electrical machine, differ from the setpoint values at the input of the power converter. In this regard, the magnitude of the supply voltage present at the power section, influenced by fluctuations resulting from residues of the input AC voltage from the rectifier, voltage raising during generator operation of the load, etc., is incorporated multiplicatively to a full level. The prior art attempts to take account of such effects through measurements and in the form of feedforward switching in the modulation. An additional factor is that the semiconductor switches have voltage drops as soon as they carry current. For active switches and in diodes, said voltage drops are generally different and dependent on the chip temperature. Such effects cannot readily be compensated for in feedforward switching with fixed values. Significant voltage errors arise as a result of the dead times which have to be inserted between the switch-off of one semiconductor switch of a half-bridge and the switch-on of the other semiconductor switch of the half-bridge following the calculation of the switching times, in order to prevent short circuits of the DC supply. Depending on the current sign, the sign of the absent voltage-time integral changes as well. This leads to considerable nonlinear distortions of the effective voltages generated and can be compensated for only in part by feedforward control with a current-dependent table since the actual switching times of the semiconductor switches, which are temperature-dependent and subject to manufacturing fluctuations, are incorporated into the offset voltages. In addition, the switching edges of the voltage are not ideal, but rather form voltage ramps, the gradient of which is in turn dependent on the current magnitude. This effect, too, is incorporated into the output voltage as an error.

SUMMARY

The invention is based on the object of overcoming such disadvantageous effects in known power converters.

The object is achieved by a polyphase power converter for outputting polyphase alternating current, wherein for each phase of the polyphase alternating current the power converter has a power output controlled via at least two semiconductor switches connected in a half-bridge circuit, wherein the power converter has a control device configured for processing a setpoint value signal, fed to the control device as input signal, in the form of a respective bit stream having a width of one bit or a plurality of bits for each phase, wherein the control device is configured for generating actuation signals of the semiconductor switches depending on the bit streams fed as input signal by means of space vector modulation. A phase of the alternating current is then available at each power output.

In this case, a bit stream is understood to mean a temporally successive sequence of bits in which the information contained therein is not represented by a sample, but rather by an average value over a sequence of successive bits of the bit stream. The information can be obtained e.g. by low-pass filtering over a sequence of successive bits of the bit stream. In this case, a bit stream can have a width of one bit or a plurality of bits, e.g. 2 to 6 bits. Such bit streams can be generated e.g. by delta-sigma modulation.

The invention has the advantage that a present input signal fed as setpoint value can be converted into the PWM signal virtually without any delay. The regulation can thus be performed virtually in an analog manner in real time using means of digital technology. The invention thus offers an improved dynamic characteristic and accuracy particularly in the case of so-called sensorless regulation of electrical machines. This becomes possible through a combination of bit streams as input signals, e.g. in the form of delta-sigma bit streams, with a processing by means of space vector modulation. This combination offers particular synergistic effects for the control of polyphase electrical machines, in particular electrical drives such as three-phase motors. The use of bit streams as input signal allows a very high-frequency clocking that is orders of magnitude higher than the PWM signals provided as output signals. Customary delta-sigma modulators can be operated e.g. with clock rates in the range of from 10 MHz to several 10 MHz. This is at least three orders of magnitude higher than frequencies of customary PWM signals, which are e.g. in the region of 4 kHz.

According to the present invention, the driving signals for the polyphase power section are generated from the bit streams fed as input signal, said bit streams each having a width of one bit or a plurality of bits. In this case, the average value of such bit streams corresponds to the desired voltage value or current value that is intended to be provided by the semiconductor switches at the power output. By using space vector modulation, in which so-called zero vectors are also generated in a targeted manner, said zero vectors applying the voltage zero to the power output, it is possible to realize a particularly effective control of electrical machines. Since the bit streams have a very high frequency compared with a digital regulation, a switching edge at the power outputs can also still be modified by signal components of the input signals which arrive only directly before the triggering of the switching process in the power converter or the control device thereof.

A further advantage of the invention is that in principle a fixed clock frequency is not necessary for the output signals at the power outputs, i.e. for the PWM signal. Rather, the present invention allows a freewheeling generation of the output signals at the power outputs without a fixed clock frequency. The noise problem mentioned in the introduction can thereby be solved. By virtue of frequencies of the output signals that change according to a random pattern or quasi-random pattern, a uniform noise no longer arises, but rather a changing noise, e.g. noise which is perceived as less disturbing. The invention thus offers very pleasant acoustics at low to medium switching frequencies. The latter should be endeavored to be achieved for reasons of energy efficiency.

Space vector modulation is based on the fact that within a switching frequency period the switch-on times for the voltage space vectors are distributed such that in the first half-period proceeding from the first zero vector (000) a switching vector is switched which switches on only one switch on the positive side of a half-bridge (V1: switching vector with only one 1), then a switching vector is switched which switches on two different half-bridges (V2: switching vector with two ones), subsequently the second zero vector (111), then once again V2, V1 and the first zero vector.

The following switching cycle thus results: 000-V1-V2-111-V2-V1-000.

In space vector modulation, the switching vectors V1 and V2 result as the switching vectors that are angularly adjacent to the setpoint voltage space vector in the hexagon of the possible switching vectors that can be set. The switch-on times of the two switching vectors V1 and V2 result from geometrical projections of the setpoint voltage space vector onto the adjacent switching vectors.

In order to avoid a situation in which, as soon as one active switching vector (V1, V2) has been switched, the information is lost regarding which zero vector was switched last and whether it would be necessary next, upon crossing a sector boundary in the voltage space vector hexagon, for another active switching vector to be switched or a zero vector, a finite state machine having at least 14 states can be used in the present invention. The finite state machine can have, besides the three bits for the coding of the switched switching vector, an additional cycle bit indicating whether the space vector modulation is in the first or second half-period of the cycle. The cycle bit does not code separate states in the switching of the zero vectors 000 and 111; therefore, only 14 instead of 16 different states, which would be codable with 4 bits, are used.

The present invention thus makes it possible to avoid the following, which occur in the prior art: disadvantageous very short switch-on times or switch-off times and associated high averaged switching frequency on individual phases and resultant higher switching losses and thermal loading of the switches.

A further advantage is that the combination of features mentioned, in particular the space vector modulation, makes it possible to achieve the maximum theoretically possible small-signal bandwidth depending on the average switching frequency.

The invention is therefore suitable for diverse fields of application for controlling polyphase electrical machines, in particular electrical drives such as three-phase machines. In particular, the invention is suitable for all types of three-phase industrial drives, from low to high powers, in particular those which can be driven without a multilevel converter. Furthermore, the invention is suitable for sensorless drives, i.e. drives without a rotational speed sensor, specifically owing to the good voltage regulation characteristic thereof. The invention is also suitable for the field of electric mobility, i.e. electric vehicles and hybrid vehicles. The improved acoustics and overall low switching frequencies result in pleasant, convenient operation of electric motors in conjunction with low losses. Owing to the outstanding voltage mapping of the invention, it is possible to achieve a very good regulation quality in conjunction with good voltage utilization. The invention is also suitable for other types of power converters for energy supply, e.g. for connecting a DC grid to a three-phase AC grid.

In accordance with one advantageous development of the invention, the control device is configured to process the bit streams, fed as input signal, digitally with bit streams derived from fed-back output signals of the control device, wherein a bit stream of the respective power output derived from a fed-back output signal of the control device is assigned to each bit stream fed as input signal. The bit streams derived from a fed-back output signal of the control device can be fed back again e.g. directly from internal switching bits of the control device, such as e.g. the bits of the finite state machine, to an input circuit, which processes these fed-back bit streams digitally with the bit streams fed as input signal. Processing at an analog level is thus not required. Continuous digital processing is performed, thereby avoiding inaccuracies or losses resulting from analog/digital conversions, or vice versa.

In accordance with one advantageous development of the invention, the space vector modulation has an angle hysteresis and/or a magnitude hysteresis of the voltage space vector. The regulation quality can be improved further by each of these measures and, in particular, a combination of these measures. The angle hysteresis allows the plane of the voltage space vector to be divided into mutually overlapping sectors, e.g. sectors with an opening angle of 120° in each case. An additional bit, e.g. the cycle bit mentioned, which indicates the respective running direction within the sector, can then be added in order to realize the angle hysteresis. By means of the magnitude hysteresis and the angle hysteresis, the switching frequency of the semiconductor switches can be limited to permissible or specification-conforming values and an impermissibly high switching frequency, which might even thermally destroy the semiconductor switches, can be avoided.

In accordance with one advantageous development of the invention, the control device has a switching table, in which the plane of the voltage space vector is divided into at least 12 areas. Disturbances of the modulation as a result of dead time effects can be minimized as a result. Further improvements arise if the switching table is extended to the effect that the plane of the voltage space vector is divided into at least 24 areas. By means of the switching table, the driving signals for the semiconductor switches can be generated directly.

In accordance with one advantageous development of the invention, the space vector modulation has one or a plurality of limit values, wherein the control device has a comparator configured for comparing the magnitude of the voltage space vector with the limit value or the limit values and for triggering a switching function in the case where the magnitude of the voltage space vector exceeds such a limit value. In this case, exceedance of the limit value is considered to be, in particular, an exceedance from a small magnitude value toward a large magnitude value or conversely from a large magnitude value toward a small magnitude value, the limit value being passed in each case. This allows an additional improvement of the quality of the modulation of the signals output at the power outputs.

In accordance with one advantageous development of the invention, the control device is configured for variably changing the limit value or the limit values depending on the respective setpoint value signal fed as input signal and/or depending on the magnitude of the voltage space vector. This allows diverse further improvements of the regulation characteristic. In this regard, particularly in the case of a small setpoint value signal, the limit value or the limit values can be reduced in order to ensure a uniform regulator behavior. Upon a corresponding rise in the setpoint value signal, the limit value or the limit values can be tracked, i.e. increased. Moreover, a regulation of the average switching frequency of the PWM signals output via the power outputs can be carried out by means of the limit values.

In accordance with one advantageous development of the invention, the control device is configured, upon the highest limit value being exceeded, to implement a reset signal for the targeted reduction of values stored in digital accumulators of the control device. This has the advantage that the power converter can also be operated with a good regulation characteristic in the event of overmodulation or overdriving, i.e. setpoint value signals which are fed as input signal and which cannot be implemented on the basis of the given parameters. In particular, it is possible to realize a soft transition to the range of the overmodulation or overdriving. By reducing the values, e.g. by erasing bits, it is possible to limit the values summed in the digital accumulators or the gradient of said values.

The highest limit value allows, in particular, a soft transition by targeted reduction of the values. As a result, it is then not necessary to keep a special reserve for the current regulation, and so the entire signal range can be utilized.

The object mentioned in the introduction is furthermore achieved by a polyphase power converter for outputting polyphase alternating current, wherein for each phase of the polyphase alternating current the power converter has a power output controlled via at least two semiconductor switches connected in a half-bridge circuit, wherein the power converter has a control device configured for processing a setpoint value signal, fed to the control device as input signal, in the form of a respective bit stream having a width of one bit or a plurality of bits for each phase, wherein the control device is configured to process the bit streams, fed as input signal, digitally with bit streams derived from fed-back output signals of the control device, wherein a bit stream of the respective power output derived from a fed-back output signal of the control device is assigned to each bit stream fed as input signal, wherein the power converter has bit stream generating means for generating the bit streams derived from fed-back output signals of the control device, wherein the bit stream generating means are configured for converting the analog voltages and/or currents output at the power outputs into bit streams. The invention has the advantage that all influences which as a result of the hardware used and, in particular, the variable parameters thereof, such as dead time effects, temperature influence and characteristic curves, can be completely precluded by feedback of the from the signals actually present at the electrical machine or other load. In particular, the disadvantages mentioned in the introduction which were previously intended to be compensated for by the feedforward switching can be overcome in a considerably improved manner. In particular, all power converter nonlinearities are thus precluded. The bit stream generating means can be embodied as delta-sigma modulators, for example, which digitize the analog output signal of the control device, e.g. the analog voltage output there or the current flowing in the respective phase to the electrical machine or other load, into a respective bit stream having a width of one bit or a plurality of bits.

In particular, motor simulation or some other network is not necessary for this purpose. The electrical data present at the electrical machine or other load can be acquired directly.

A further advantage is that in the case of detecting the analog currents and feeding them back in the form of bit streams, the power converter can also be configured for the current regulation of the currents output via the power outputs. In this way, a current regulation is simultaneously possible with the concept of the power converter being unchanged. Said current regulation is required in many applications of electrical machines and grid power converters. Advantageously, the power converter according to the invention requires essentially no additional components for this purpose, apart from the respective analog detection means for measuring the analog currents, which are necessary anyway in a current regulation. In the current regulation, bit streams, in particular, can be fed as input signals and thus as setpoint value signals, the average value of said bit streams specifying a setpoint current.

In particular, the current regulation can be carried out in combination with the feedback of bit streams representing voltage signals. A voltage regulation with superposed current regulation can be realized in this way. In this case, the regulator can be kept stable by means of the voltage regulation. The current regulation then predominates over the voltage regulation, e.g. by the use of a regulator having a high gain, such as e.g. a P regulator.

In accordance with one advantageous development of the invention, the control device has a regulating unit configured to determine the average switching frequency of the output signals of the power outputs and to carry out a regulation of the average switching frequency to a predefined setpoint value. In this way, the power converter, which is freewheeling per se with regard to the switching frequency, can be improved in such a way that the switching frequency is stabilized and is kept at least in a specific bandwidth around the setpoint value. The regulation of the average switching frequency can be carried out e.g. by adaptation of the limit values of the voltage space vector, said limit values already having been explained above. If the average switching frequency is to be increased, the limit values tend to be decreased; if the average switching frequency is to be reduced, the limit values tend to be increased.

In accordance with one advantageous development of the invention, the control device has on the input side a quanta decoder in combination with an increment table, which is configured to decode the bit streams fed as input signal into quanta (in accordance with the thesis by Nitish Patel, "Bit-Streams—Applications in Control", May 2006, the University of Auckland, New Zealand) and to sum them correctly in terms of sign to form increments. In this regard, in one step e.g. each bit stream can be decoded into ternary quanta having the values +1, 0, −1 and, together with the ternary quanta of the bit streams derived from a fed-back output signal of the control device, in an increment table, can be added together to form the increments for the digital accumulators (in the case of a two-channel design of the control device, i.e. for two digital accumulators).

In accordance with one advantageous development of the invention, the control device has at least two digital accumulators connected downstream of the increment table, wherein the digital accumulators are configured to sum the increments output by the increment table. The digital accumulators are thus designed in a similar manner to counters. The digital accumulators can have e.g. a word width of a plurality of bits, e.g. six, eight or ten to twenty bits. The word width should not be chosen to be too small, in order to avoid excessively high switching frequencies.

In accordance with one advantageous development of the invention, the increment table is configured to weight the quanta of fed bit streams which represent current signals differently than the quanta of fed bit streams which represent voltage signals, in order to achieve a regulator gain. By this means, too, the quality of the regulation can be improved further, particularly if a current regulation is necessary.

The digital words present in the digital accumulators can be fed to a switching table connected downstream, which is part of the control device. On the output side, the switching table can output the switch-on and switch-off signals for the semiconductor switches, wherein flip-flops or other storage components are connected downstream of the switching table in order to realize a switching mechanism. In the case of an e.g. three-phase embodiment of the power converter, three flip-flops are then required for the respective phases and, with application of cycle control, an additional flip-flop is required for the cycle bit. In the case of a three-phase embodiment, this gives rise to a four-bit storage by the flip-flops. To put it in general terms, n+1 bits or flip-flops are required if n is the number of phases of the polyphase power converter.

The object mentioned in the introduction is additionally achieved as claimed in claim 15 by a computer program for controlling a polyphase power converter for outputting polyphase alternating current, wherein for each phase of the polyphase alternating current the power converter has a power output controlled via at least two semiconductor switches connected in a half-bridge circuit, wherein the computer program has program code means, configured for carrying out the following method when the computer program is executed on a computer of the power converter:
  processing a setpoint value signal, fed to the power converter as input signal, in the form of a respective bit stream having a width of one bit or a plurality of bits for each phase,
  generating actuation signals of the semiconductor switches depending on the bit streams fed as input signal by means of space vector modulation.

The invention can thus be realized in a manner implemented completely by software with defined hardware, completely by hardware or partly in software and partly in hardware. As the computer mentioned above, it is possible to use e.g. a fast microprocessor or a microcontroller, a digital signal processor, an FPGA or some other gate array or a comparable electronic circuit.

The embodiments of the invention as explained above include, in particular, the generation of the actuation signals of the semiconductor switches by means of space vector modulation. Space vector modulation is an advantageous type of modulation in particular for three-phase systems, i.e. three-phase power converters and loads operated in a three-phase manner by means of the power converter. However, the advantageous actions and effects of the invention can also be realized in the case of power converters with fewer phases, e.g. when driving a two-pole load that can be driven in a bipolar manner by means of the power converter. In other words, each terminal of the two-pole load can be switched over between an upper and a lower link voltage via the power converter. As a result, in particular, electric motors can be operated in both directions of rotation, i.e. their polarity can be reversed. For driving such loads, the power converter can have e.g. a power section having two half-bridge circuits of semiconductor switches, between which the load is connected in the sense of a bridge circuit. Such a circuit arrangement is also referred to as H-bridge circuit or H-bridge for short.

A shared characteristic of the above-described polyphase power converters, e.g. of three-phase power converters, and of the H-bridge circuit is that for generating the desired alternating current signal at a terminal of the load a plurality of switching possibilities of the semiconductor switches are present in order to generate the desired signal. In this regard, in the case of an H-bridge, for example, an alternating current can be generated by a procedure in which only ever the upper semiconductor switch of one half-bridge is switched on and off and the lower semiconductor switch of the other half-bridge remains permanently switched on. Conversely, it is also possible for the upper semiconductor switch of one half-bridge to be permanently switched on and for only the lower semiconductor switch of the other half-bridge to be switched on and off. In both cases, the same AC voltage signal is generated at the load. What is disadvantageous here is the unequal loading of the semiconductor switches that occurs in particular during switch-over on account of the switching losses. As a consequence, the semiconductor switches are heated to different extents, such that different cooling measures are required. That can be counteracted by the invention. The disadvantages explained can be avoided by the advantageous, intelligent control of the semiconductor switches by means of the control device and the switching sequences generated thereby. In accordance with one embodiment of the invention, therefore, the control device, e.g. by the switching mechanism thereof, is configured to generate switching sequences of the actuation signals of the semiconductor switches by which the loading of the semiconductor switches is distributed uniformly among the semiconductor switches on average over time. In this regard, e.g. in the embodiment with the H-bridge, on account of the advantageous configuration of the control device the upper and lower semiconductor switches can be switched over uniformly often on average over time, independently of what mode of operation the connected load is intended to have, e.g. whether permanent operation of an electric motor in only one direction of rotation is required, or a frequent change of the direction of rotation.

As a result, the invention is suitable in particular for driving electric motors, e.g. in the form of stepper motors.

In accordance with one advantageous development of the invention, the switching mechanism has, in addition to state bits which correspond to the output switching signals and thus to the actuation signals of the semiconductor switches, at least one additional bit in the form of a cycle bit by which the uniform distribution of the loading of the semiconductor switches is controlled. By means of the cycle bit, it is thus possible to set a "marker" as to how the semiconductor switches were actuated in the past, such that a corresponding evening out of the switching of the semiconductor switches in the future can be achieved by evaluation of the cycle bit. Advantageously, this evening out of the loading of the semiconductor switches can already be achieved with a minimal storage overhead in the form of a single bit, namely the cycle bit. It is not necessary to store the entire actuation history in the form of many storage words or storage bits for each semiconductor switch. Such a functionality can be achieved just with one cycle bit.

The advantages described above with regard to the embodiment of the invention with space vector modulation can also be realized in the case of the embodiment just described. Conversely, the advantages described below also apply to the embodiment with space vector modulation.

The invention is suitable, in particular, for small drives with DC motors and stepper motors. Bit streams having a width of one or a plurality of bits serve as setpoint value signal. Bit streams having a width of one bit are advantageous, in particular, which can be generated e.g. by delta-sigma modulation. In this case, the average value of the bits of the bit stream corresponds to the desired voltage value that is intended to be generated at the power output of the power converter. The invention makes it possible to use, in a targeted manner, freewheeling states of the power converter, e.g. both half-bridges switched on the positive side or both half-bridges switched on the negative side, by means of which the voltage 0 is generated at the power output.

The advantages explained can furthermore be achieved by means of a computer program as claimed in claim 31.

BRIEF DESCRIPTION OF THE DRAWINGS

The invention is explained in greater detail below on the basis of exemplary embodiments with the use of drawings.

In the figures.

In the figures, identical reference signs are used for mutually corresponding elements.

DETAILED DESCRIPTION

As an exemplary embodiment, it is proposed to construct, as a control device, a modulator for the pulse width modulation of a power converter, which contains a vectorial voltage setpoint value in the form of three bit stream signals at the input, and to form a vectorial integral error therefrom with fed-back switch signals, which either are tapped off directly at the output of the modulator still within the signal electronics or are obtained from phase voltages measured in an analog manner via delta-sigma modulators. Said error is quantized with respect to magnitude and phase into at least 12 areas, better 18 with the possibility of limiting the error in the case of overdriving, and is rated in a switching table. Together with four state storage bits, a switching mechanism arises which generates switching sequences in a targeted manner, which switching sequences, in the case of normal modulation, form cycles such as correspond to space vector modulation. Cycle: (<0, 0, 0>, V1, V2, <1, 1, 1>, V2, V1, <0, 0, 0>) (see table 1). In this case, three of the state bits correspond directly to the output switching signals; the fourth bit indicates the running direction in the cycle <0, 0, 0>, <1, 1, 1> or <1, 1, 1>, <0, 0, 0>. In the case of higher degrees of modulation, the cycle is shortened to a change between V1 (one bit set) and V2 (two bits set). If the voltage setpoint value has even greater magnitudes, a seamless transition to the overdriving additionally takes place, in which overdriving increments of the error store are erased correctly in terms of angle in order to prevent overflows and nevertheless to modulate the correct phase of the desired output vector.

TABLE 1

| Switching vector $<P_3, P_2, P_1>$ | Type |
| --- | --- |
| <0, 0, 0> | Zero |
| <1, 1, 1> | Zero |
| <0, 0, 1> | V1, active |
| <0, 1, 0> | V1, active |
| <1, 0, 0> | V1, active |
| <1, 0, 1> | V2, active |
| <0, 1, 1> | V2, active |
| <1, 1, 0> | V2, active |

Figure 1:
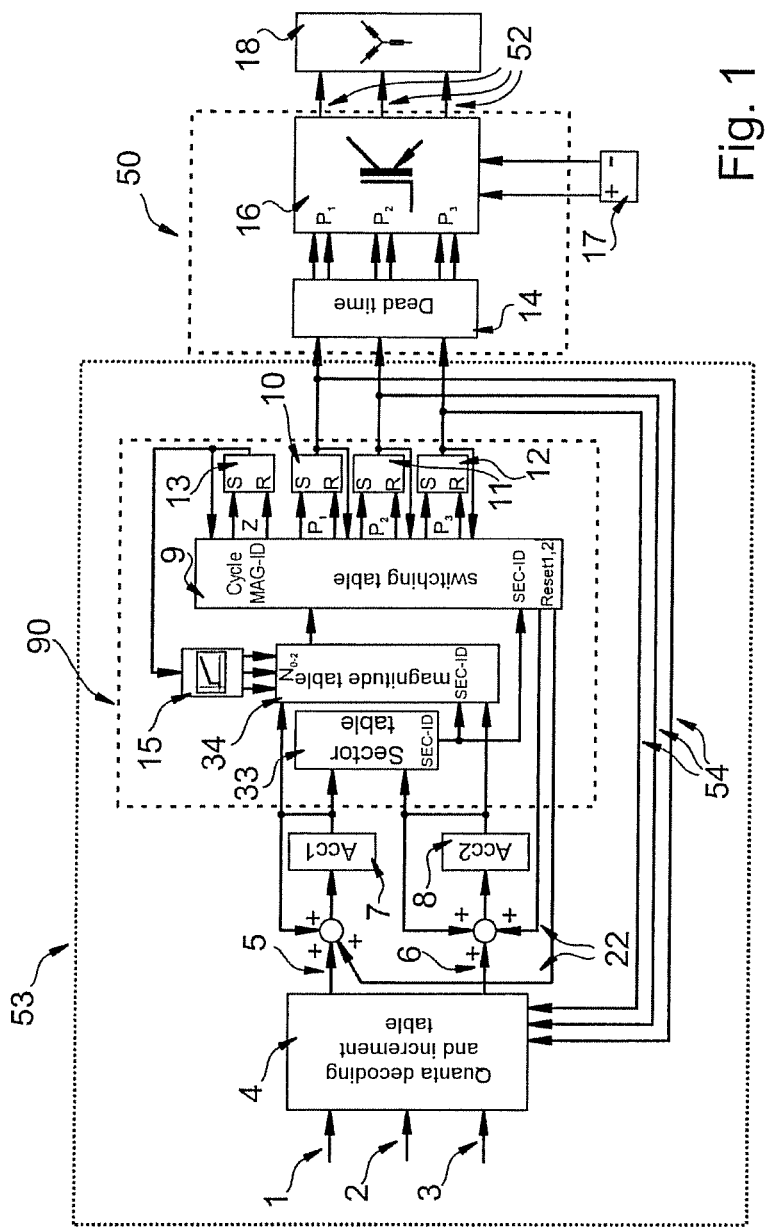
FIG. 1 shows a first embodiment of a power converter.

FIG. 1 shows a schematic circuit diagram of the signal processing used for a modulator with feedback of the switch signals within the signal processing. The circuit receives at the setpoint value input as input signal and thus as setpoint value signal three delta-sigma bit streams 1, 2, 3 for the vectorial voltage setpoint value at the output. The output bits of the switching mechanism 90 are fed as fed-back bit streams 54 together with the bit streams 1, 2, 3 of the input signal to the quanta decoder 4 with the increment table, which carries out an increment formation. The quanta decoder 4 extended by the increment table vis-à-vis the proposal by Patel shall be designated hereinafter only as quanta decoder, for the sake of linguistic simplification. In said quanta decoder, the three bit streams 1, 2, 3 are firstly decoded into ternary quanta (+1, 0, −1) by comparison with a zero bit stream (square-wave signal in which the successive bits change between 0 and 1). As indicated in table 2, the quanta are weighted for the subsequent summation in the digital accumulators 7, 8. The output bits of the switching mechanism 90 are subjected to a quanta decoding just like the setpoint values. The quanta decoder 4 generates two output signals 5, 6, wherein in accordance with table 2 the proportions of setpoint and actual values are already added, having the width of a plurality of bits, which are accumulated in the digital accumulators 7, 8 together with two reset signals 22 from the switching mechanism 90 to form in each case an integral digital word with sign.

TABLE 2

|  | Acc1 | Acc2 |
|---|---|---|
| $U_{setpoint1}$ | +1 | 0 |
| $U_{setpoint2}$ | 0 | +1 |
| $U_{setpoint3}$ | −1 | −1 |
| $U_{actual1}$ | −1 | 0 |
| $U_{actual2}$ | 0 | −1 |
| $U_{actual3}$ | +1 | +1 |

If an overmodulation is desired, the input signal 1, 2, 3 in the quanta decoder 4 can obtain greater weights than the feedback signal, i.e. the output bits of the switching mechanism 9. The output signals 5, 6 of the quanta decoder 4 having the respectively possible values <+2, +1, 0, −1, −2> (deviating values can occur in the case of higher weighting of the input) are fed to the digital accumulators 7, 8, which add them up with each clock cycle of the bit streams. Furthermore, the reset signals 22 from the switching mechanism 9, which serve for limiting the error in the case of overdriving, are concomitantly accumulated in the digital accumulators 7, 8. Two digital words having signs with a word width of 6 to 20 bits are available downstream of the digital accumulators 7, 8 and are fed to the switching mechanism 90. The latter in turn generates the signals for setting and erasing the three output bits stored in the flip-flops 10, 11, 12, and for a further cycle bit in accordance with flip-flop 13, which codes the half-cycle of the switching period of the space vector modulation.

Figure 2:
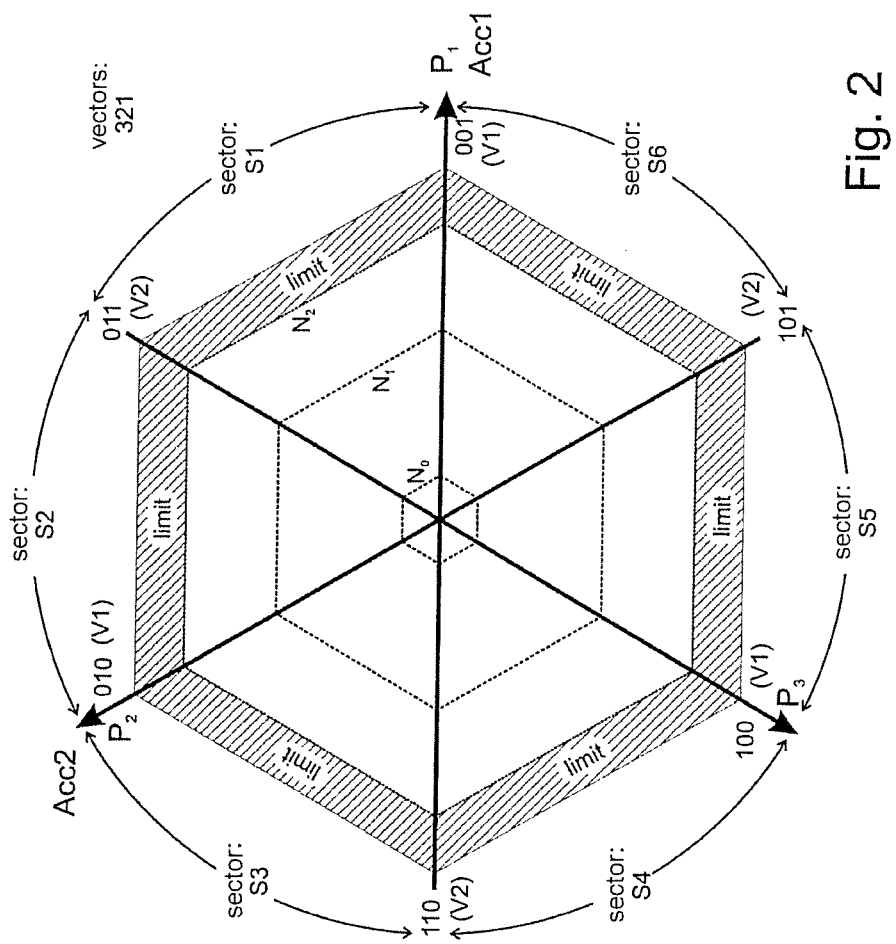
FIG. 2 shows a voltage space vector diagram.
Figure 3:
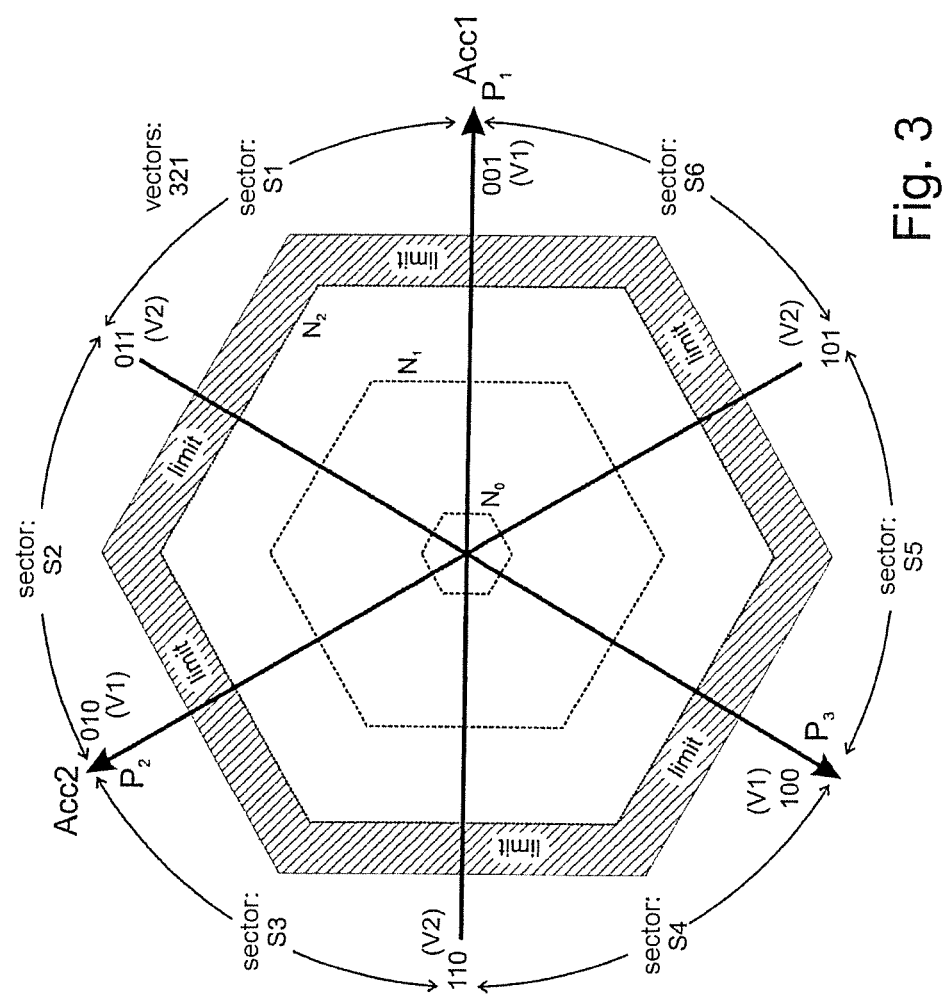
FIG. 3 shows a further voltage space vector diagram.

In accordance with FIGS. 2 and 3, the error summed in the two digital accumulators 7, 8 is vectorially quantized into at least 12 areas: six sectors S1 to S6, which are divided in each case by a limit value $N_1$ for the magnitude of the voltage space vector and thus yield 12 areas. A further improved suppression of disturbances of the modulation as a result of dead time effects arises if, for small magnitudes of the voltage space vector, the area in the vicinity of the center is also evaluated in a differentiated manner, e.g. by a further limit value $N_0$ being supplemented. In the case of an overdriving of the modulator, a differentiation in terms of magnitude in accordance with an upper (highest) limit value $N_2$ can also be supplemented for the purpose of limitation. This gives rise to a quantization into 24 areas, namely 6 sectors divided in each case into four areas by three limit values.

The magnitude formation of the voltage space vector can be effected e.g. in accordance with FIG. 2 (hexagon whose vertexes point in the direction of the vectors V1 and V2) or FIG. 3 (hexagon which is tilted by 30° with respect to FIG. 2).

The switching mechanism 90 forms a central element of the control device 53 that determines the behavior of the modulator in accordance with the space vector modulation. The behavior of the switching mechanism 90 is explained below with reference to FIG. 2, which shows the voltage error accumulated in the digital accumulators 7, 8, corresponding to Acc1 and Acc2, in a 120° coordinate system.

In the switching mechanism, with the aid of the sector table 33, firstly the sector number is determined with the aid of the error vector with the two components which from the contents of the digital accumulators 7, 8 in a coordinate system whose axes form an angle of 120° with respect to one another, as presented in table 3.

TABLE 3

| Acc1 <= 0 | Acc2 >= 0 | Acc2 − Acc1 >= 0 | Sector |
|---|---|---|---|
| X | 1 | 0 | S1 |
| 0 | X | 1 | S2 |
| 1 | 1 | X | S3 |
| X | 0 | 1 | S4 |
| 1 | X | 0 | S5 |
| 0 | 0 | X | S6 |

After the determination of the sector (S1 . . . S6), with the aid of the magnitude table 34 the magnitude of the error vector is determined and then differentiated as to whether it is less than $N_0$, between $N_0$ and $N_1$, between $N_1$ and $N_2$, or above $N_2$. This can be coded with a magnitude identification, also called magnitude ID or MAG-ID, with the aid of the following table, for example.

| Sector | Magnitude condition | Magnitude ID |
|---|---|---|
| S1 | Acc1 < $N_0$ | 0 |
| S1 | $N_0$ < Acc1 < $N_1$ | 1 |
| S1 | $N_1$ < Acc1 < $N_2$ | 2 |
| S1 | Acc1 > $N_2$ | 3 |
| S2 | Acc2 < $N_0$ | 0 |
| S2 | $N_0$ < Acc2 < $N_1$ | 1 |
| S2 | $N_1$ < Acc2 < $N_2$ | 2 |
| S2 | Acc2 > $N_2$ | 3 |
| S3 | Acc1 − Acc2 > $N_0$ | 0 |
| S3 | $N_0$ > Acc1 − Acc2 > $N_1$ | 1 |
| S3 | $N_1$ > Acc1 − Acc2 > $N_2$ | 2 |
| S3 | Acc1 − Acc2 < $N_2$ | 3 |
| S4 | Acc1 > −$N_0$ | 0 |
| S4 | −$N_0$ > Acc1 > −$N_1$ | 1 |
| S4 | −$N_1$ > Acc1 > −$N_2$ | 2 |
| S4 | Acc1 < −$N_2$ | 3 |
| S5 | Acc2 > −$N_0$ | 0 |
| S5 | −$N_0$ > Acc2 > −$N_1$ | 1 |
| S5 | −$N_1$ > Acc2 > −$N_2$ | 2 |
| S5 | Acc2 < −$N_2$ | 3 |
| S6 | Acc2 − Acc1 > −$N_0$ | 0 |
| S6 | −$N_0$ > Acc2 − Acc1 > −$N_1$ | 1 |
| S6 | −$N_1$ > Acc2 − Acc1 > −$N_2$ | 2 |
| S6 | Acc2 − Acc1 < −$N_2$ | 3 |

The switching mechanism furthermore incorporates in the instantaneously switched output vector in the state bits 10, 11, 12 and the cycle bit 13. Depending on the currently present setpoint value signals in accordance with the bit streams 1, 2, 3 and the currently switched voltage vector at the output of the modulator, the error vector in Acc1, Acc2 from clock cycle to clock cycle of the bit stream signal describes a path through the areas of the hexagon in FIG. 2 or 3. The arising of a switching cycle can thus be explained as follows.

If it is assumed that, at the beginning of the consideration, all four output bits <$P_3$, $P_2$, $P_1$, Z>, i.e. the state bits 10, 11, 12 and the cycle bit 13, are zero and that the voltage error <Acc1, Acc2> is likewise zero, then the error state is situated exactly in the center of the coordinate system. If a setpoint value signal in accordance with the bit streams 1, 2, 3 is now predefined as an average value, then the setpoint value quanta from the quanta decoder 4 enter the digital accumulators 7, 8, without quanta being supplied from the actual value signals originating from the state bits 10, 11, 12, because precisely a zero vector is switched as voltage vector. Thus, with each clock cycle of the setpoint value signals, the error vector moves out of the center and its magnitude exceeds the limit value $N_1$ at some time. An active switching vector is then switched here.

The switching vectors that are switched by the three half-bridges of the power section 16 can be classified into three types in accordance with table 1: if all three switches are switched with respect to the positive rail of the link voltage <1, 1, 1> or all three switches are switched with respect to the negative side <0, 0, 0>, then no difference voltage is present at the output terminals. These switching vectors are designated as zero vector. There are then also switching vectors for which only one switch is switched with respect to the positive side; these are assigned the type V1, and correspondingly the type V2 in the case of two switches being switched with respect to the positive side. V1 and V2 are also designated as active switching vectors because the voltage present at the load is different than zero.

The switching mechanism is designed such that the switching cycles correspond to the space vector modulation. This gives rise to a cycle in which, proceeding from the zero vector <0, 0, 0>, a switching vector V1, then a switching vector V2, the zero vector <1, 1, 1>, and back V2, V1 and the zero vector <0, 0, 0> are switched. This cycle is the normal cycle that results if the magnitude of the voltage setpoint value can be modulated in all angular positions without the overdriving of the power section. Depending on the magnitude of the required voltage space vector, further possible cycles result in which switching is carried out only between two active switching vectors.

The normal cycle of the space vector modulation arises if the error vector in <Acc1, Acc2>, proceeding from the state <$P_3$, $P_2$, $P_1$, Z>=<0, 0, 0, 0> and <Acc1, Acc2>=<0, 0>, moves across the limit $N_1$. The sector in which the error vector <Acc1, Acc2> is situated is then determined. This sector is limited by a switching vector type V1 and on the other side by a switching vector type V2 (FIG. 2 or 3). Since the cycle bit 13 is zero, the switching vector V1 is switched and the bits 10, 11, 12 <$P_3$, $P_2$, $P_1$> are correspondingly set. This state remains until the error vector <Acc1, Acc2> leaves in any direction the area of the two sectors which lie next to the currently output switching vector V1. If this sector boundary is crossed, then the switching vector V2 is switched, which limits the newly entered sector on one of the sides. If moreover the magnitude of the error vector is outside $N_1$, then the cycle bit 13 is additionally set. The further sequence then corresponds to the second half of the switching cycle. By contrast, in the case of a magnitude within $N_1$, the cycle bit remains at zero and the switched switching vector V2 is switched until the error vector leaves the area of the two sectors which lie next to the currently output switching vector V2. If the error vector is then still within $N_1$ and the cycle bit is zero, then the zero vector <1, 1, 1> is switched and the cycle bit 13 is set. If the magnitude becomes less than $N_0$ while the switching vector V2 is switched, then immediately the zero vector <1, 1, 1> is switched and the cycle bit 13 is set. The error vector has now passed in two steps for instance in the direction of the center of the hexagon because the active switching vectors in normal operation have a greater magnitude than the setpoint value. After the switching of the zero vector, the setpoint value in accordance with the bit streams 1, 2, 3 with a magnitude of greater than zero has the effect that the error vector passes in the outward direction again. With the limit value $N_1$ being exceeded again in terms of magnitude and with the cycle bit being set, now the switching vector V2 is switched, which limits the present sector at one side. This remains switched until departure from the area formed by the two sectors which lie next to the currently switched switching vector V2. Since the cycle bit is now set, the switching vector V1 which limits the currently entered sector at one side is switched next. If the magnitude of the error vector here is greater than $N_1$, then the cycle bit is additionally erased. Otherwise the switching vector V1 remains switched until departure in turn from the 120° area assigned to this switching vector. Then the zero vector <0, 0, 0> is switched and the cycle bit is erased and the cycle starts from the very beginning again.

The sequences just explained
<0, 0, 0, 0>=>V1=>V2=><1, 1, 1, 1>=>V2=>V1=><0, 0, 0, 0> or
<V1, Z=0>=><V2, Z=1>=><V1, Z=0> etc.

proceed only if the setpoint value in accordance with the bit streams 1, 2, 3 does not constrain overmodulation. If the setpoint values have a greater magnitude, then that has the effect that the quanta fed back from the state bits 10, 11, 12 <$P_3$, $P_2$, $P_1$> or the voltage actual values to the quanta decoder do not suffice to return the error vector in <Acc1, Acc2> to the center of the hexagon again. The error magnitude would increase above all limit values and lead at some time to overflows and hence a malfunction of the modulator. Therefore, with the magnitude limit $N_2$, a limiting function takes effect in the switching mechanism. If the error vector exceeds the limit value $N_2$ in terms of magnitude, a pair of integers is output on the reset signals 22 and returns the error vector in parallel with the currently switched switching vector into the magnitude range between $N_1$ and $N_2$ again. Only such quanta which lie in the direction of the currently switched switching vector are thus erased. Quanta laying transversely with respect thereto are accumulated further and ensure that ultimately a modulation between a V1, V2 pair arises which on average correctly reproduces at least the angle of the setpoint vector at the output.

The further parts of the schematic diagram in FIG. 1 serve for elucidating the integration of the control device into a power converter. The switch signals <$P_3$, $P_2$, $P_1$> generated from the state bits 10, 11, 12 are provided with dead times in a switching block 14 and transferred to the power section 16 as switch driving signals. The power section 16 is fed by a DC voltage source 17 and supplies the three-phase load 18.

A regulating device 15 measures the switching frequency on the cycle bit 13 and tracks the three limit values $N_0$, $N_1$, $N_2$ of the magnitude table 34 in the same ratios, such that a desired average switching frequency is corrected. Smaller values of the limit values $N_0$, $N_1$, $N_2$ increase the switching frequency because fewer clock cycles are required to trigger a switching event. The three state bits 10, 11, 12 <$P_3$, $P_2$, $P_1$> are fed back together with the cycle bit 13 into the switching mechanism as a state.

Figure 4:
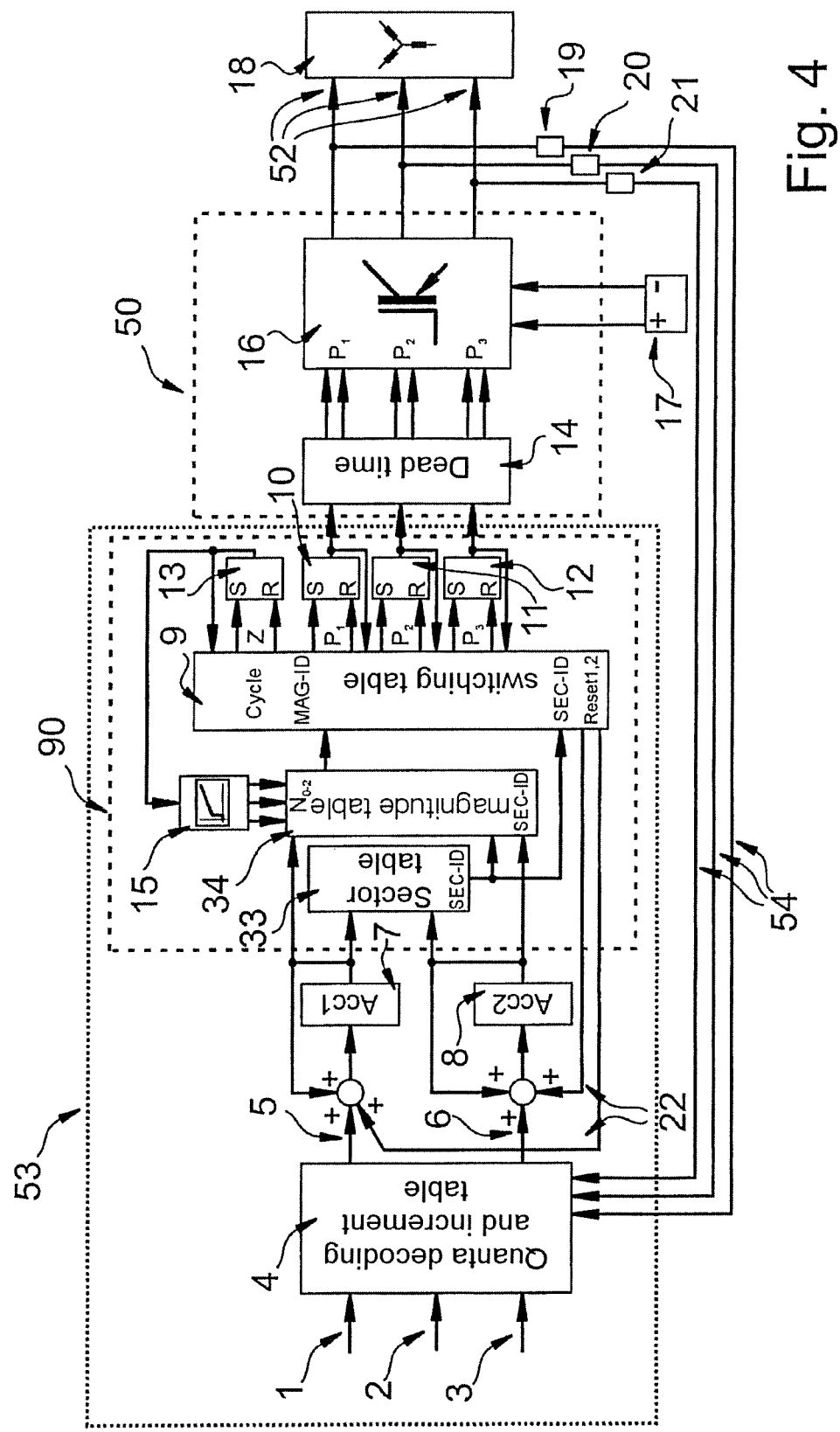
FIG. 4 shows a second embodiment of a power converter.

FIG. 4 shows a schematic circuit diagram of a modulator for a three-phase power section with a corresponding load, but here with a feedback of the measured analog voltages instead of the internal state bits 10, 11, 12. The analog voltages are digitized via analog delta-sigma modulators 19, 20, 21 and are output as bit streams 54. These bit streams now pass into the quanta decoder instead of the state bits and are processed in accordance with table 2. The scaling of the bit streams 1, 2, 3 at the input is now determined by the scaling of the input voltage ranges of the delta-sigma modulators 19, 20, 21. The switched output voltages are measured directly as phase potentials, e.g. relative to the link voltage rail or relative to the ground potential or some other suitable common potential, in analog form via the delta-sigma modulators 19, 20, 21 without further interposed filters. This has the advantage that all occurring mapping errors of the voltage setpoint values in the output voltage e.g. as a result of a fluctuating link voltage, dead time effects, voltage drops in the conducting state, gradient of the switching edges, are compensated for immediately without delay in the present switching cycle.

The modulator as a result generates a driving of the power section with extremely high quality. The average switching frequency is not constant, but rather depends on the amplitude, the frequency and the angle of the setpoint value, the link voltage and the limit values $N_0$, $N_1$, $N_2$ set; however, the variation bandwidth is also not too wide. As a result of the stochastic properties of the delta-sigma signals used, the switching frequency is subject to permanent statistical fluctuations, even in steady-state operation with parameters kept constant, which determine the average switching frequency. This effect should be rated entirely positively because the electromagnetic compatibility of the power section is influenced positively by the variation of the frequency components in the frequency range and the acoustic impression of such a drive is also advantageous in comparison with one with a constant switching frequency.

If a three-phase voltage system having a constant amplitude and frequency is generated, for example, the voltage magnitude corresponds exactly to the setpoint value at least upon feedback of the measured analog output voltages. The phase lagging is very low, and so a very large bandwidth should be expected in the current regulation on the basis of this method, compared with conventional sampled regulation. A group delay of the modulator of approximately 10 μs was ascertained at an average switching frequency of 16 kHz. A further advantage of the arrangement should be seen in the fact that low-frequency sampling in the kilohertz range no longer exists for this type of signal processing. Since the delta-sigma signals are sampled e.g. in the region of 10 MHz, signal processing virtually free of sampling can be assumed.

The modulator can be extended for current regulation. Many drives and grid power converters are operated with current regulation. Therefore, it is advantageous to additionally integrate current regulation into the modulator. This is possible with low additional outlay in the case of the present invention.

Figure 5:
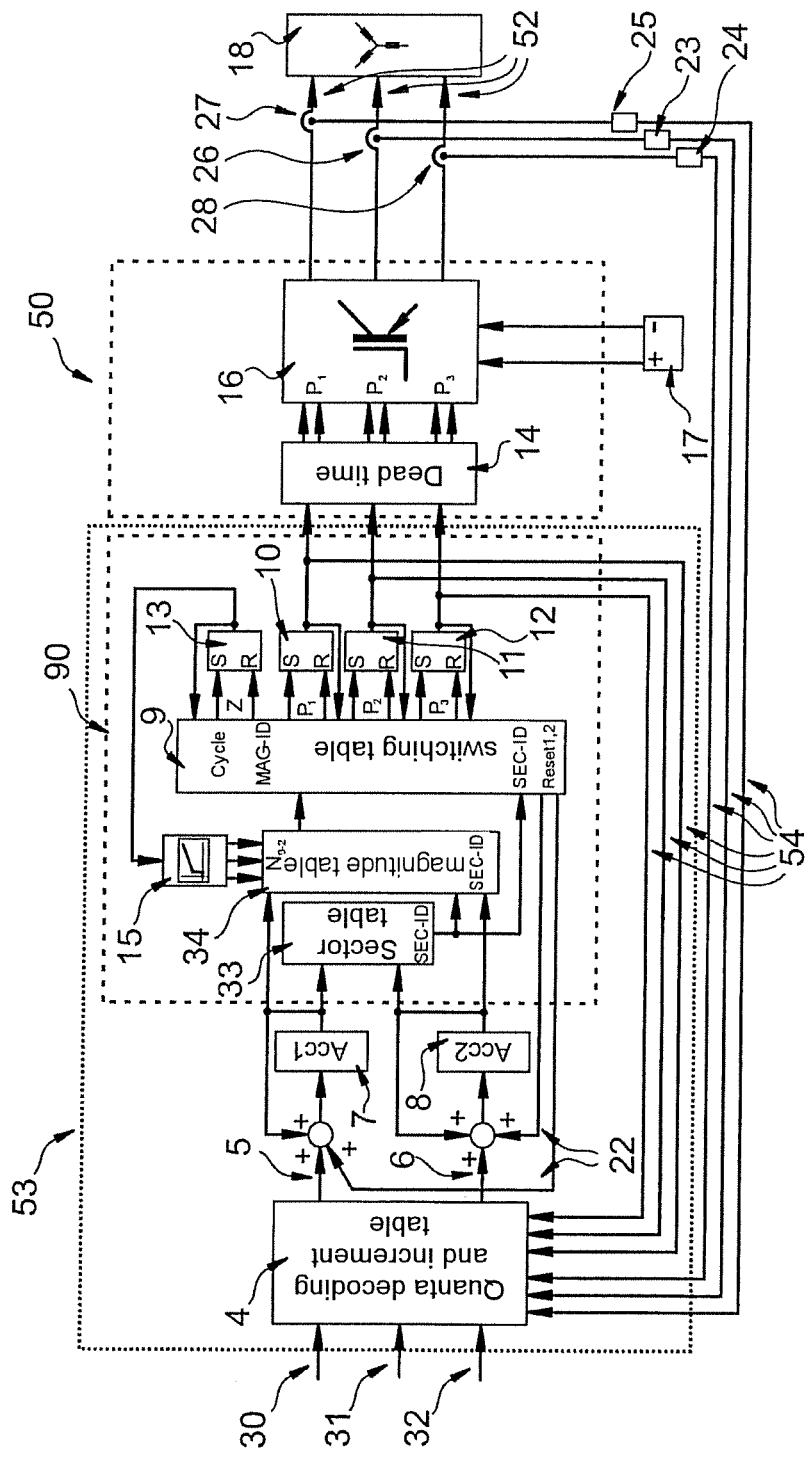
FIG. 5 shows a third embodiment of a power converter.

Only three further measured values for the currents are required, but they are necessary anyway for current regulation. The measured values of the currents are detected via current detection means 26, 27, 28 and converted into bit stream signals by delta-sigma modulators 23, 24, 25. FIG. 5 shows a schematic circuit diagram of the construction.

The schematic circuit diagram in accordance with FIG. 5 is largely identical to FIG. 1. In contrast to FIG. 1, three further inputs for the bit stream signals of the delta-sigma modulators 23, 24, 25 are provided in the quanta decoder 4. Bit streams 30, 31, 32 representing current setpoint values are now fed in as input signals and setpoint value signals. For effective current regulation, the weights for the current setpoint value and current actual value quanta are increased significantly, e.g. by the factor V=10 . . . 50, relative to the quanta for the voltage actual values. The quanta decoder table is presented in table 4.

TABLE 4

|  | Acc1 | Acc2 |
|---|---|---|
| $I_{setpoint1}$ | +V | 0 |
| $I_{setpoint2}$ | 0 | +V |
| $I_{setpoint3}$ | −V | −V |
| $I_{actual1}$ | −V | 0 |
| $I_{actual2}$ | 0 | −V |
| $I_{actual3}$ | +V | +V |
| $U_{actual1}$ | −1 | 0 |
| $U_{actual2}$ | 0 | −1 |
| $U_{actual3}$ | +1 | +1 |

Moreover, the limit values $N_0$, $N_1$, $N_2$ have to be increased in order to prevent the switching frequency from becoming too high. The arrangement can be regarded as an upstream current regulator, which in this case operates as a P regulator. One advantage of the arrangement over known solutions is that the current actual values are incorporated practically without delay into the calculation of the switching instants of the voltage modulation and that the limitation of the current regulator outputs is automatically ensured by the type of switching signal generation and it is thus possible to utilize all voltage reserves right into overmodulation.

Figure 6:
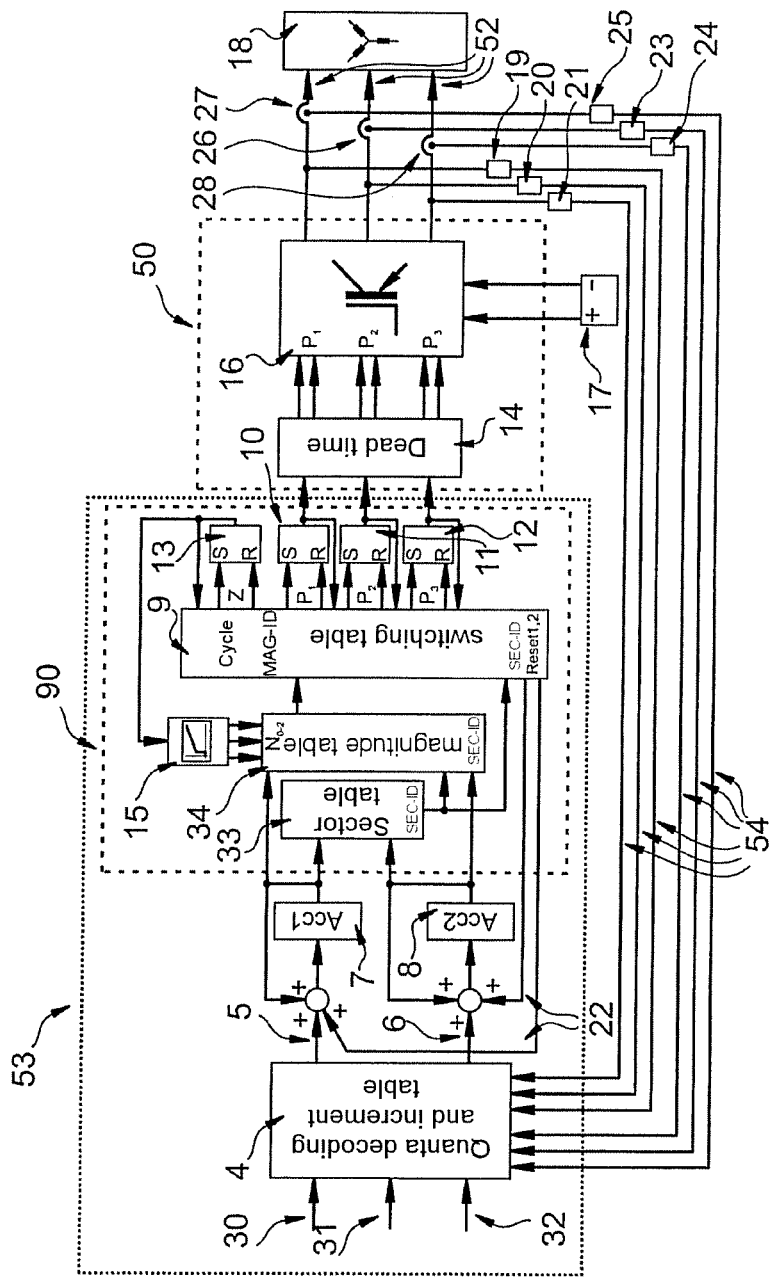
FIG. 6 shows a fourth embodiment of a power converter.

This type of current regulation can likewise be combined with the feedback of the measured output voltages as explained with reference to FIG. 4, as shown in FIG. 6.

Figure 7:
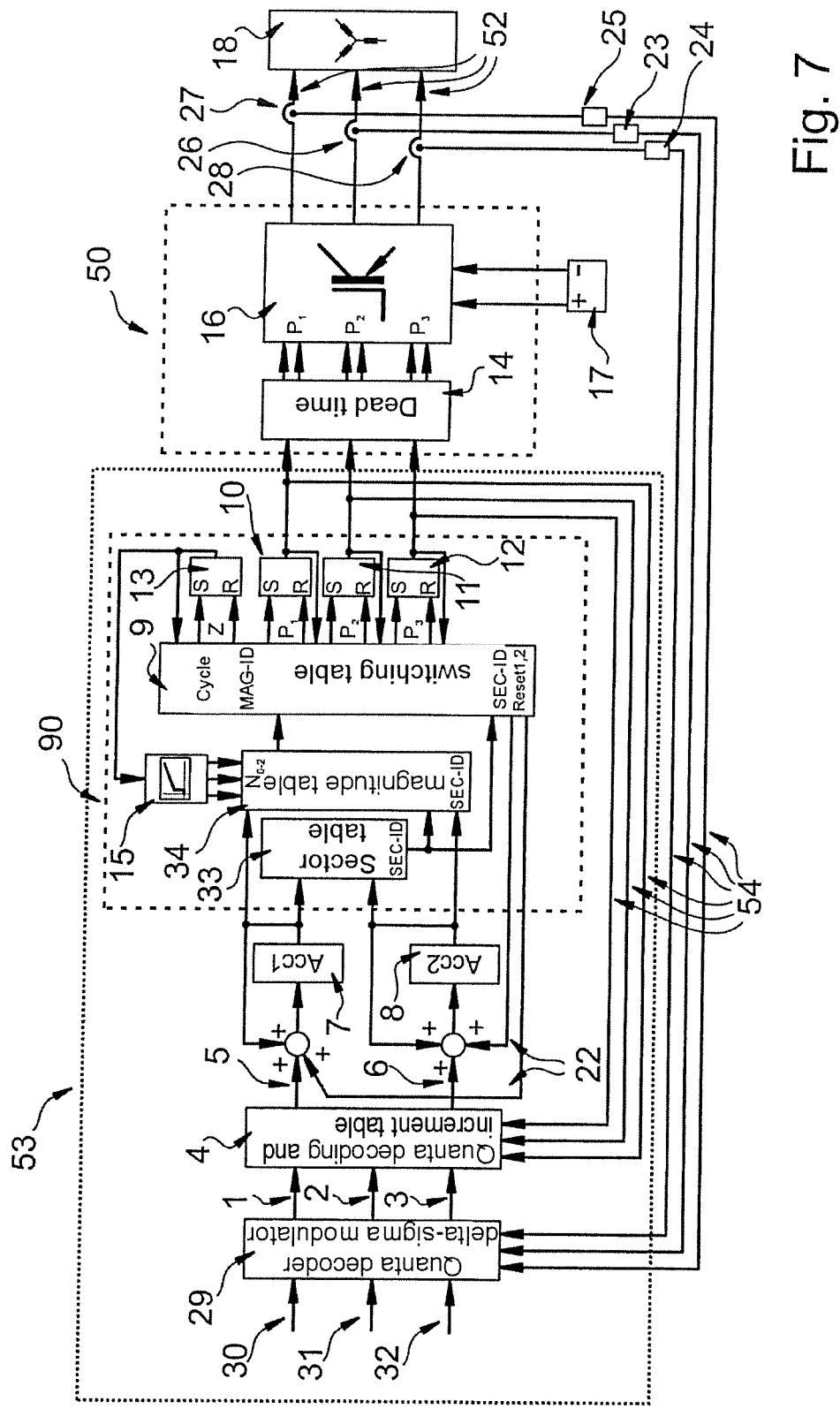
FIG. 7 shows a fifth embodiment of a power converter.

The current regulation can also be carried out in an independent regulator block that is not combined with the quanta decoding of the voltage regulation. In this case, a digital delta-sigma modulator has to be inserted respectively for the three components of the voltage setpoint value signal. This configuration is illustrated in FIG. 7. A difference between the bit streams 30, 31, 32 representing current setpoint values and the bit streams from the delta-sigma modulators 23, 24, 25 representing current actual values is formed in a block 29 by means of a quanta decoder with increment table and subsequent digital delta-sigma modulators. In this case, a proportional gain is simultaneously generated by means of a sufficiently large gain factor V. The rest of the structure remains as described above.

Figure 8:
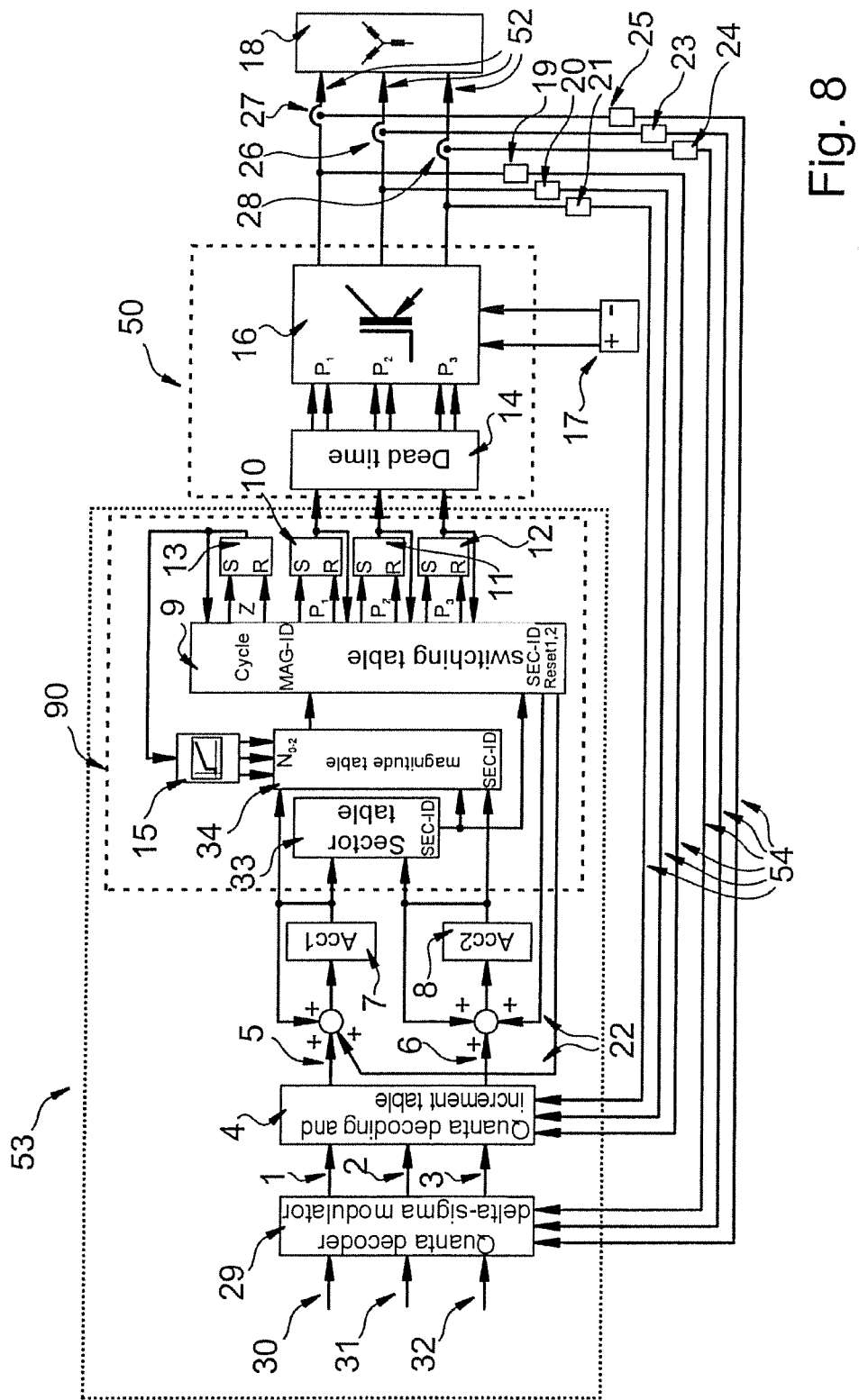
FIG. 8 shows a sixth embodiment of a power converter.

The circuit can be modified further by the analog values of the phase potentials at the power section once again being used for the voltage feedback, as explained with reference to FIG. 4, and being fed via delta-sigma modulators into the quanta decoder 4 of the voltage regulating circuit. This configuration is shown in FIG. 8.

Figure 9:
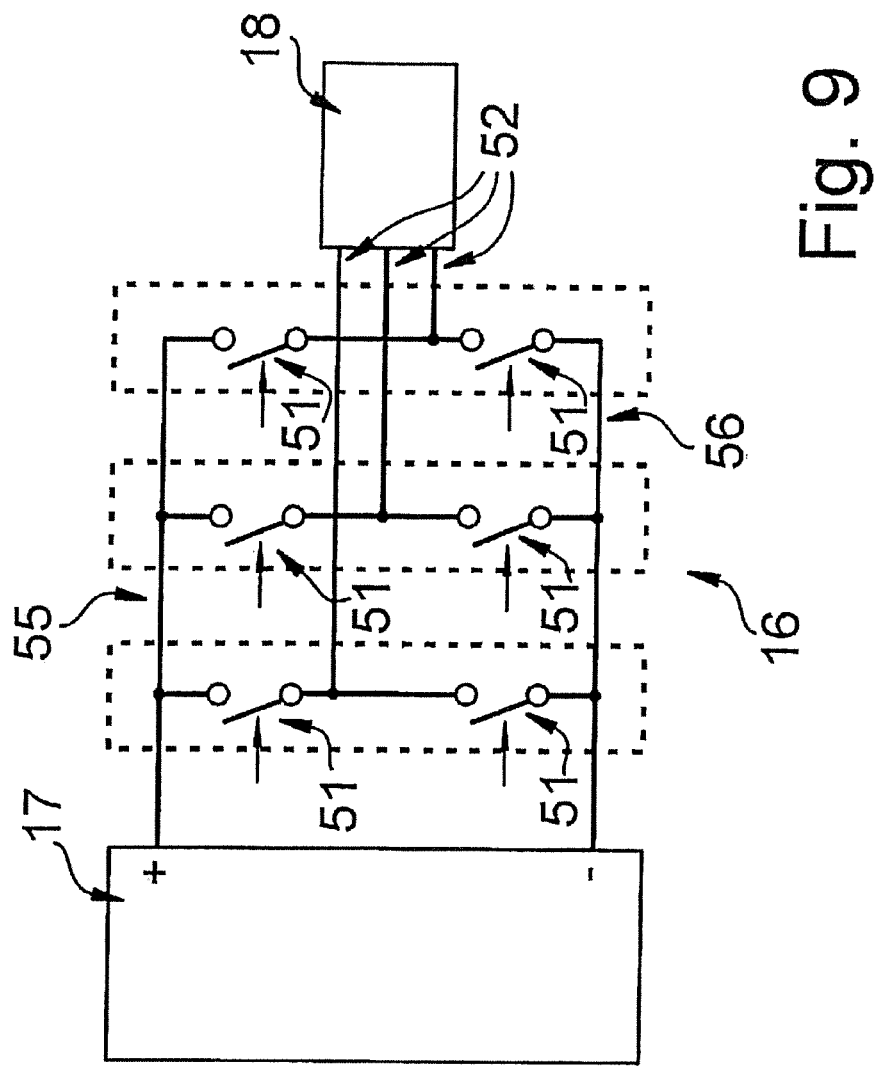
FIG. 9 shows the basic construction of the power stage of a power converter, in which half-bridge circuits are used.

An explanation is given below, with reference to FIGS. 10 to 12, of a two-phase embodiment of the power converter, such as is advantageous e.g. for driving two-pole loads such as DC motors or a winding phase of a stepper motor. The power section 16 of such a power converter corresponds, in principle, to the construction in accordance with FIG. 9, wherein one of the three half-bridges is absent and the load 18 correspondingly has only two terminals. Correspondingly, only two power outputs 52 are present as well, to which the load 18 is connected by its two terminals. In such a case, the space vector diagram, as illustrated in FIGS. 2 and 3, is simplified to a scalar representation, as reproduced in FIG. 12. Only one digital accumulator Acc1 is required in this case. Furthermore, the lower limit value $N_0$ is obviated. Advantageously, the limit values $N_1$, $N_2$ can still be maintained, with a function comparable to that described above.

The embodiments of a power converter of three-phase design as described above with reference to FIGS. 1 to 8 can be adopted in the two-phase embodiment, in which case simplifications can be realized. This is illustrated by way of example on the basis of two exemplary embodiments reproduced pictorially in FIGS. 10 and 11. In a corresponding manner, the other three-phase embodiments explained above can also be adopted with their features for the two-phase embodiment with the corresponding simplifications.

The setpoint value signal fed as input signal can be provided by a single bit stream 1 in the two-phase embodiment. It is also possible for two bit streams to be fed, wherein one bit stream represents the inverse of the other bit stream. In this respect, e.g. one bit stream 1, as illustrated in FIGS. 10 and 11, can be fed externally and can be provided internally, e.g. in the quanta decoder 4, additionally as an inverted bit stream. An external inverter for generating the second, inverted bit stream can also be coupled to the bit stream 1.

In contrast to the three-phase embodiment, as mentioned, one digital accumulator can be omitted. Accordingly, only the one digital accumulator 7 (Acct) is reproduced in FIGS. 10 and 11. Consequently, the sector table 33 explained above can also be omitted. Further simplifications arise in the switching mechanism 90, e.g. by omission of a flip-flop (here flip-flop 11 by way of example) and with regard to the switching table 9 and the magnitude table 34.

Figure 10:
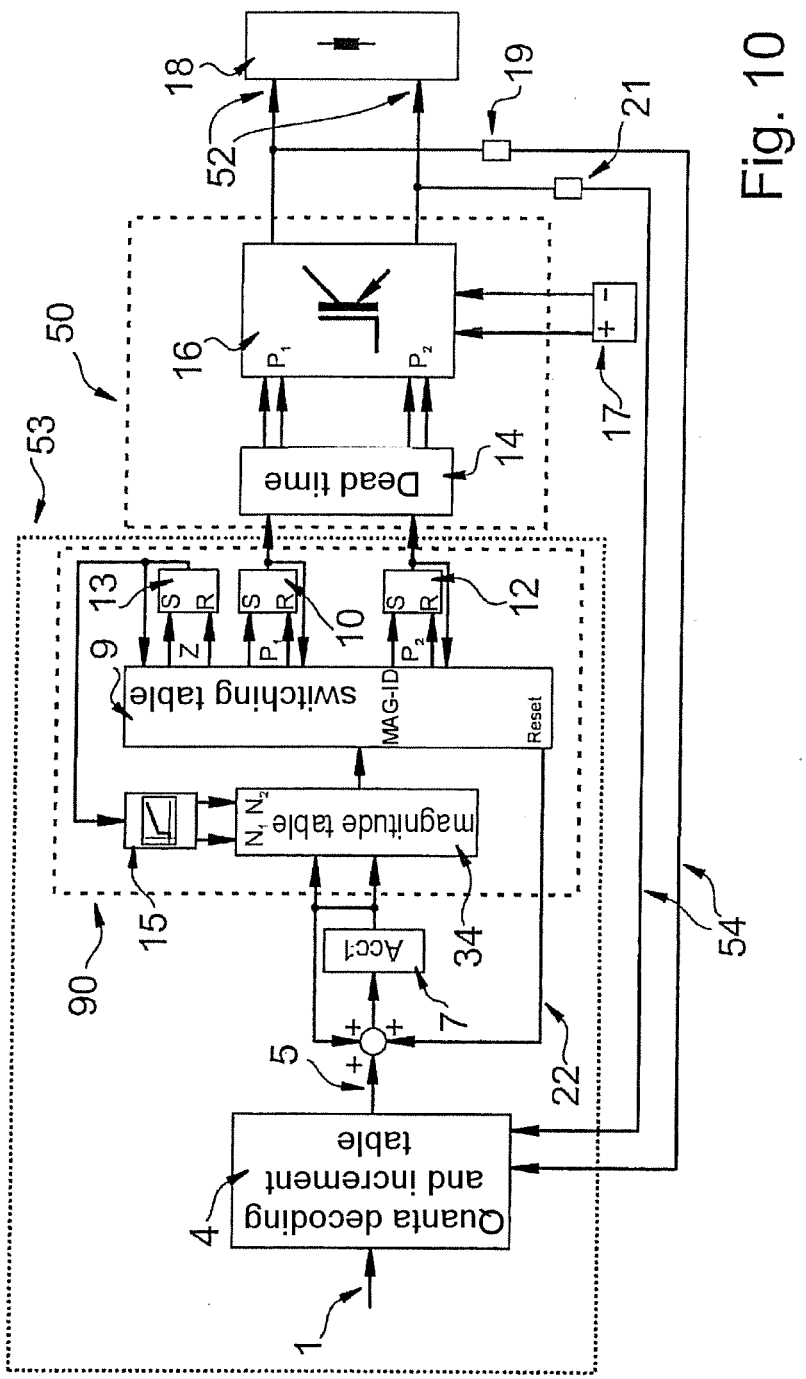
FIG. 10 shows a seventh embodiment of a power converter and FIG. 11 shows an eighth embodiment of a power converter and FIG. 12 shows a functional diagram with regard to the seventh and eighth embodiments of the power converter.

For the rest, FIG. 10 shows a two-phase embodiment comparable with the embodiment in accordance with FIG. 4, i.e. with a feedback of the measured analog voltages instead of the internal state bits. Here, too, the analog voltages are once again digitized via analog delta-sigma modulators 19, 21 and fed back as bit streams 54 to the quanta decoder 4.

Figure 11:
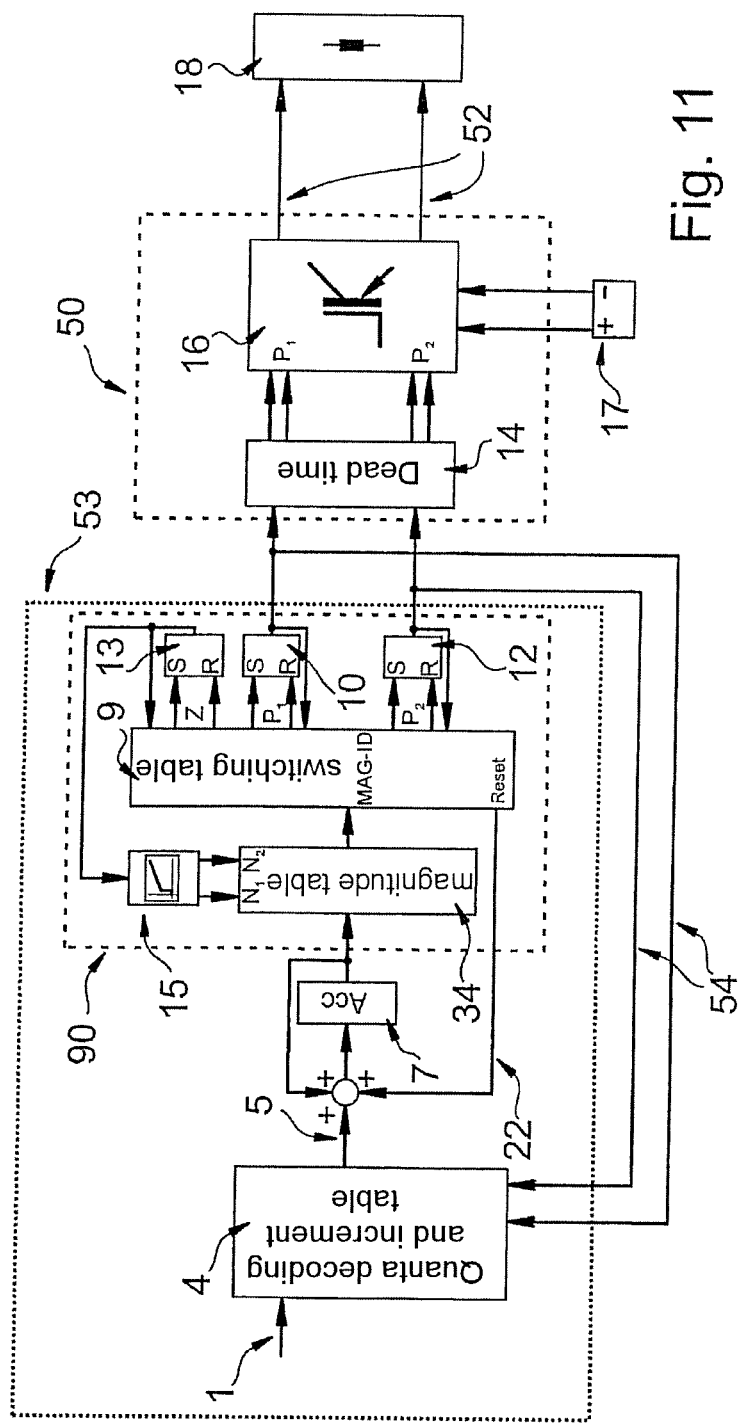

The embodiment in accordance with FIG. 11 is a two-phase embodiment of the above-explained embodiment in accordance with FIG. 1, i.e. with internal feedback of the digital output signals of the flip-flops 10, 12. As is evident, the other three-phase embodiments can also be simplified to two-phase embodiments in a corresponding manner.

In the case of the two-phase embodiment, the switching table 9, as reproduced above in table 1 for the three-phase embodiment, can be simplified in accordance with the following table.

TABLE 5

| Switching vector <$P_2$, $P_1$> | Type |
| --- | --- |
| <0, 0> | Zero |
| <1, 1> | Zero |
| <0, 1> | Active |
| <1, 0> | Active |

The quanta table in the quanta decoder 4 reproduced above in table 2 in the case of the three-phase embodiment can now be represented as follows.

TABLE 6

|  | Acc1 |
| --- | --- |
| U1setpoint | +1 |
| U1actual | −1 |
| U2actual | +1 |

The table used in the magnitude table 34 can be specified as follows.

TABLE 7

|  | Magnitude ID |
| --- | --- |
| 0 <= Acc1 <= $N_1$ | 1 |
| $N_1$ < Acc1 <= $N_1$ | 2 |

TABLE 7-continued

|  | Magnitude ID |
| --- | --- |
| $N_1$ < Acc1 | 3 |
| $-N_1$ <= Acc1 < 0 | 4 |
| $-N_1$ <= Acc1 < $-N_1$ | 5 |
| Acc1 < $-N_1$ | 6 |

Figure 12:
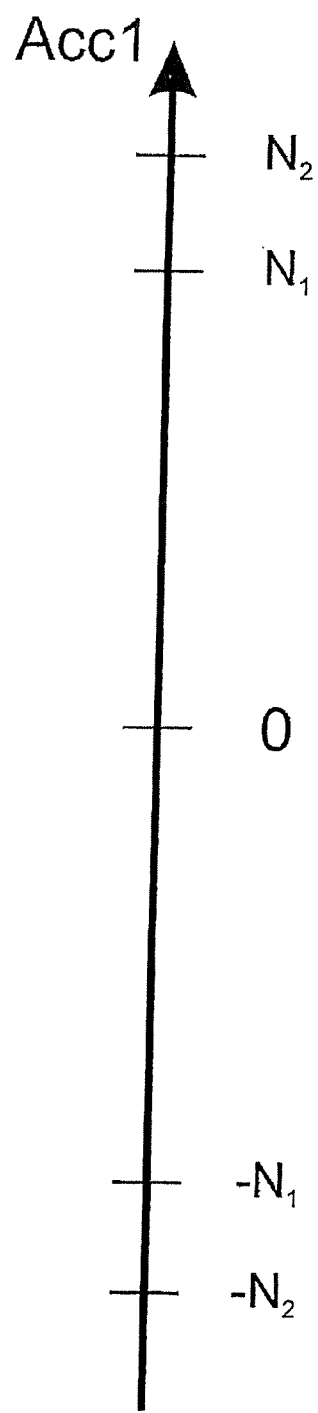

With the magnitude table 34, the number ray illustrated in FIG. 12 is thus divided into six areas that are coded numerically by the output variable of the magnitude table 34. The output variable of the magnitude table 34 is then a magnitude identification, also called magnitude ID or MAG-ID, which indicates by numerical coding the value interval in which the content of the digital accumulator Acc1 is located.

By additionally taking account of the cycle bit Z, for which the flip-flop 13 is provided on the output side of the switching table 9, the generated actuation signals of the semiconductor switches, taking account of the switching table 9 mentioned above, can be generated as follows and thus distributed uniformly among the semiconductor switches.

With reference to FIG. 12, it shall firstly be assumed that a positive setpoint value is present, that is to say that the setpoint value signal fed as input signal in the form of the bit stream 1 predefines a positive voltage setpoint value. With regard to the vector <$P_2$, $P_1$, Z> formed from the two actuation signal bits $P_2$, $P_1$ and the cycle bit Z, a start value of <0, 0, 0> is initially taken as a basis. It shall be assumed that the digital accumulator Acc1 now runs toward positive values, i.e. from zero upward in the illustration in FIG. 12. If the limit value $N_1$ is then exceeded, an active vector <$P_2$, $P_1$, Z>=<0, 1, 0> is generated by the switching mechanism 90, in particular the switching table 9. As a result of the processing in the switching mechanism this has the effect that the digital accumulator Acc1 runs in the direction of smaller values, i.e. in the direction of 0, again. If the digital accumulator Acc1 in this case falls below the zero limit, a 0 vector <$P_2$, $P_1$, Z>=<1, 1, 1> is generated. This in turn has the effect that the digital accumulator Acc1 runs in the direction of positive values. In the case of the limit value $N_1$ being exceeded, in turn the active vector <$P_2$, $P_1$, Z>=<0, 1, 1> is generated, this time with a set cycle bit Z=1. Thus, with regard to the alternating current to be generated at the power output, or the corresponding AC voltage, the same effect is generated as previously in the case of the active vector switched for the first time, but a different semiconductor switch is actuated. Afterward, the digital accumulator Acc1 runs in the direction of 0 again. In the case of the value zero being undershot, identified on the basis of the set cycle bit Z=1, a different zero vector <$P_2$, $P_1$, Z>=<0, 0, 0> is now generated. With the continuing presence of a positive setpoint value in the bit stream 1 fed, the cycle just described begins once again from the outset, that is to say that the cycle bit is now not set. Accordingly, the active vector mentioned first is generated, etc.

In the case of the negative setpoint value, characterized by the bit stream 1, an analogously identical procedure takes place, but with inverted signs. In this case, the digital accumulator Acc1 is between the value 0 and the limit value $-N_1$. Firstly, in the case of the limit value $-N_1$ being undershot, the active vector <$P_2$, $P_1$, Z>=<1, 0, 0> is generated and, after the digital accumulator Acc1 returns to the value 0 and after further undershooting of the limit value $-N_1$, the same active vector <$P_2$, $P_1$, Z>=<1, 0, 1> is generated, this time with a set cycle bit Z=1. The zero vectors are also changed correspondingly. This change between zero vectors is controlled by the cycle bit Z.

An overdriving can occur here as well. If the magnitude of the setpoint value signal fed as input signal is so high that the digital accumulator Acc1, after the switching of the active vector, nevertheless exceeds the limit value $N_2$ (or falls below $-N_2$), then a fixed number of increments is subtracted in the digital accumulator Acc1, which brings the digital accumulator Acc1 back again into the range between the limit values $N_1$ and $N_2$, in particular in a range near $N_1$ or somewhat above the limit value $N_1$. In the case of a negative setpoint value signal, in principle the same function is carried out, except with negative signs and the negative limit values $-N_1$ and $-N_2$. In accordance with one advantageous configuration of the invention, the difference between the limit values $N_1$ and $N_2$ can be chosen to be very small. Accordingly, the maximum value occurring in the digital accumulator Acc1 is subjected to hard limitation to an upper limit value in the region of $N_2$ or $-N_2$.

In the two-phase embodiment described here, too, the switching frequency can be influenced. The switching frequency is greatly dependent on the magnitude of the input signal. In the case of magnitude values of the input signal near zero, the switching frequency becomes relatively low. A corresponding dynamic characteristic of the actuation signals generated is nevertheless present because in the case of a voltage requirement for example from a superordinate current regulating circuit the magnitude of the voltage requirement rapidly rises and triggers a switching process.

As in the case of the three-phase embodiment, in the case of the two-phase embodiment, too, an external current regulating circuit can be provided, as illustrated e.g. in the case of the three-phase embodiment in FIG. 5. A quanta decoder table then used, indicated in table 4 in the case of the three-phase embodiment, can then be manifested as follows.

TABLE 8

| | Acc1 |
|---|---|
| $I_{setpoint1}$ | +V |
| $I_{actual1}$ | -V |
| $I_{actual1}$ | -1 |
| $I_{actual2}$ | 1 |

The current regulating circuit can be integrated either directly into the quanta decoder of the voltage feedback, with different amplification of the quanta from the voltage and current signals, or in the form of an additional control loop with a dedicated quanta decoder and subsequent digital delta-sigma modulator.

The remaining function blocks illustrated in FIGS. 10 and 11 correspond in terms of their function and description to the features described above for the three-phase embodiment, with the difference that only two actuation signals $P_2$, $P_1$ are generated and processed.

The invention claimed is:

1. A polyphase power converter for outputting polyphase alternating current, comprising:
   at least two semiconductor switches connected in a half-bridge circuit for controlling each phase of the polyphase alternating current output by the polyphase power converter;
   a control device configured for processing a setpoint value signal fed to the control device as an input signal in a form of a bit stream having a width of one bit or a plurality of bits for each phase, wherein the control device is configured for generating by space vector modulation actuation signals of the at least two semiconductor switches depending on the bit stream fed as the input signal; and
   a switching logic for generating switching sequences of the space vector modulation which utilizes
      state bits which correspond to the actuation signals of the at least two semiconductor switches, and
      at least one additional bit in a form of a cycle bit which indicates a running direction in a cycle of a voltage space vector,
   wherein the space vector modulation executed by the control device has an angle hysteresis of the voltage space vector, and
   wherein the angle hysteresis is realized by the cycle bit,
   wherein the space vector modulation utilized by the control device has one or a plurality of limit values, wherein the control device has a comparator configured for comparing the magnitude of the voltage space vector with the one or the plurality of limit values and for triggering a switching function in a case where a magnitude of a voltage space vector exceeds the one or the plurality of limit values, and
   wherein the control device is configured such that upon a highest limit value of the one or the plurality of limit values being exceeded, a reset signal for targeted reduction of values stored in digital accumulators of the control device is implemented.

2. The power converter as claimed in claim 1, wherein the control device has a switching table in which a plane of a voltage space vector is divided into at least twelve areas.

3. The power converter as claimed in claim 1 wherein the control device is configured for variably changing the one or the plurality of limit values depending on a respective setpoint value signal fed as the input signal and/or depending on the magnitude of the voltage space vector.

4. The polyphase power converter of claim 1, wherein the control device is further configured for generating actuation signals of the at least two semiconductor switches depending on the bit stream or the bit streams by a switching mechanism configured for generating switching sequences of the actuation signals by which the loading of the at least two semiconductor switches is distributed uniformly among the at least two semiconductor switches on average over time.

5. The power converter as claimed in claim 4 wherein the switching mechanism has, in addition to state bits which correspond to the actuation signals of the at least two semiconductor switches, at least one additional bit in a form of a cycle bit by which a uniform distribution of loading of the at least two semiconductor switches is controlled.

6. The power converter as claimed in claim 4 wherein the power converter has two half-bridge circuits arranged in an H-bridge circuit, and between the two half-bridge circuits a load to be driven by the power converter is connectable.

7. The power converter as claimed in claim 4 wherein the control device has a switching table.

8. A polyphase power converter for outputting polyphase alternating current, comprising:
   at least two semiconductor switches connected in a half-bridge circuit for controlling each phase of the polyphase alternating current output by the polyphase power converter;
   a control device configured for processing a setpoint value signal fed to the control device as an input signal, in a form of a bit stream having a width of one bit or a plurality of bits for each phase, wherein the control device is configured to process bit streams fed as input signal digitally with bit streams derived from fed-back output signals of the control device, wherein a bit stream derived from a fed-back output signal of the control device is assigned to each bit stream fed as input signal; and delta-sigma-modulators for generating the bit streams derived from fed-back output signals of the control device, wherein the delta-sigma-modulators are configured for converting analog voltages and/or currents output at power outputs into bit streams, wherein the bit streams generated by the delta-sigma modulators are one bit wide bit streams, wherein the control device has on an input side a quanta decoder in combination with an increment table which is configured to decode the bit streams fed as input signal into quanta and to sum the decoded bit streams fed as input signal correctly in terms of sign to form increments which are stored in an increment table.

9. The power converter as claimed in claim 8 wherein the power converter is configured for current regulation of currents output via the power outputs.

10. The power converter as claimed in claim 8 wherein the control device has a regulating unit configured to determine an average switching frequency of output signals of the power outputs and to carry out a regulation of the average switching frequency to a predefined setpoint value.

11. The power converter as claimed in claim 8 wherein the control device has at least two digital accumulators connected downstream of the increment table, wherein the digital accumulators are configured to sum increments output by the increment table.

12. The power converter as claimed in claim 8 wherein the increment table is configured to weight quanta of fed bit streams which represent current signals differently than quanta of fed bit streams which represent voltage signals, in order to achieve a regulator gain.

13. A polyphase power converter for outputting polyphase alternating current, comprising:

at least two semiconductor switches connected in a half-bridge circuit for controlling each phase of the polyphaser alternating current output by the polyphaser power converter;

a control device configured for processing a setpoint value signal fed to the control device as an input signal in a form of one or a plurality of bit streams having a width of one bit or a plurality of bits, wherein the control device is configured to process the one or the plurality of bit streams fed as the input signal digitally with bit streams derived from fed-back output signals of the control device; and delta-sigma modulators for generating the bit streams derived from fed-back output signals of the control device, wherein the delta-sigma modulators are configured for converting analog voltages and/or currents output at power outputs into bit streams, wherein the bit streams generated by the delta-sigma modulators are one bit wide bit streams, wherein the control device has on an input side a quanta decoder in combination with an increment table, which is configured to decode the one or the plurality of bit streams fed as the input signal into quanta and to sum the quanta correctly in terms of sign to form increments.

14. The power converter as claimed in claim 13 wherein the power converter is configured for current regulation of currents output via the power outputs.

15. The power converter as claimed in claim 13 wherein the control device has a regulating unit configured to determine an average switching frequency of output signals of the power outputs and to carry out a regulation of the average switching frequency to a predefined setpoint value.

16. The power converter as claimed in claim 13 wherein the control device has at least one digital accumulator connected downstream of the increment table, wherein the digital accumulator is configured to sum the increments output by the increment table.

17. The power converter as claimed in claim 16 wherein the control device has one or a plurality of limit values, wherein the control device has a comparator configured for comparing the value summed in the digital accumulator, or a value determined therefrom, with the one or the plurality of limit values and for triggering a switching function in a case where a limit value is exceeded.

18. The power converter as claimed in claim 17 wherein the control device is configured for variably changing the one or the plurality of limit values depending on a respective setpoint value signal fed as the input signal and/or depending on a value summed in the digital accumulator or a value determined therefrom.

19. The power converter as claimed in claim 17 wherein the control device is configured, upon a highest limit value of the one or the plurality of limit values being exceeded, to implement a reset signal for targeted reduction of a value stored in the digital accumulator of the control device.

20. The power converter as claimed in claim 13 wherein the increment table is configured to weight quanta of fed bit streams which represent current signals differently than quanta of fed bit streams which represent voltage signals, in order to achieve a regulator gain.

* * * * *